(12) United States Patent
Luan et al.

(10) Patent No.: US 12,389,524 B2
(45) Date of Patent: Aug. 12, 2025

(54) MOLDED CIRCUIT BOARD AND CAMERA MODULE, AND MANUFACTURING METHOD THEREOF AND ELECTRONIC DEVICE

(71) Applicant: NINGBO SUNNY OPOTECH CO., LTD., Zhejiang (CN)

(72) Inventors: Zhongyu Luan, Zhejiang (CN); Zhen Huang, Zhejiang (CN); Bin Lu, Zhejiang (CN); Li Liu, Zhejiang (CN); Chengchang Zheng, Zhejiang (CN); Tinghua Li, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 522 days.

(21) Appl. No.: 17/631,565

(22) PCT Filed: Jul. 1, 2020

(86) PCT No.: PCT/CN2020/099767
§ 371 (c)(1),
(2) Date: Jan. 31, 2022

(87) PCT Pub. No.: WO2021/017743
PCT Pub. Date: Feb. 4, 2021

(65) Prior Publication Data
US 2022/0279094 A1    Sep. 1, 2022

(30) Foreign Application Priority Data

Jul. 31, 2019 (CN) .......................... 201910698550.8
Jul. 31, 2019 (CN) .......................... 201921220096.7

(51) Int. Cl.
*H05K 1/02* (2006.01)
*H05K 1/18* (2006.01)
(Continued)

(52) U.S. Cl.
CPC ........... *H05K 1/0209* (2013.01); *H05K 1/181* (2013.01); *H05K 3/06* (2013.01); *H05K 3/28* (2013.01);
(Continued)

(58) Field of Classification Search
CPC ...... H05K 5/0247; H05K 5/069; H05K 1/111; H05K 1/117; H05K 1/0209; H05K 1/181; H05K 5/0034; H05K 1/183; H05K 1/184
See application file for complete search history.

(56) References Cited

U.S. PATENT DOCUMENTS 5,965,944 A    10/1999  Frankoski et al.
11,165,941 B2  11/2021  Wang et al.
(Continued)

FOREIGN PATENT DOCUMENTS

CN    102655098    9/2012
CN    108243296    7/2018
(Continued)

OTHER PUBLICATIONS

International Search Report issued Sep. 30, 2020, in International (PCT) Application No. PCT/CN2020/099767, with English translation.
Extended European Search Report issued Aug. 30, 2022 in European Patent Application No. 20848503.7.

*Primary Examiner* — Jeremy C Norris
(74) *Attorney, Agent, or Firm* — Wenderoth, Lind & Ponack, L.L.P.

(57) ABSTRACT

Disclosed are a molded circuit board and a camera module, and a manufacturing method thereof and an electronic device comprising the same. The molded circuit board includes a circuit board main body and a molded structure. The circuit board main body includes at least one circuit layer and at least one substrate layer, wherein the circuit layer and the substrate layer are stacked in a manner of being (Continued)

spaced apart. The molded structure includes a molded layer, wherein the molded layer is stacked on at least one surface of the circuit board main body to cover at least part of the substrate.

6 Claims, 20 Drawing Sheets

(51) Int. Cl.
*H05K 3/06* (2006.01)
*H05K 3/28* (2006.01)
*H05K 3/34* (2006.01)

(52) U.S. Cl.
CPC ........... *H05K 3/341* (2013.01); *H05K 1/0298* (2013.01); *H05K 2201/10151* (2013.01)

(56) References Cited

U.S. PATENT DOCUMENTS

| | | | |
|---|---|---|---|
| 2010/0252304 | A1 | 10/2010 | Muramatsu et al. |
| 2012/0225150 | A1 | 9/2012 | Han et al. |
| 2017/0064825 | A1* | 3/2017 | Ishihara ............... H05K 1/0298 |
| 2019/0364184 | A1 | 11/2019 | Wang et al. |

FOREIGN PATENT DOCUMENTS

| | | |
|---|---|---|
| CN | 108307094 | 7/2018 |
| EP | 3 570 651 | 11/2019 |
| JP | 2017-33960 | 2/2017 |
| WO | 2018/130172 | 7/2018 |

\* cited by examiner

MOLDED CIRCUIT BOARD AND CAMERA MODULE, AND MANUFACTURING METHOD THEREOF AND ELECTRONIC DEVICE

FIELD OF THE INVENTION

The present invention relates to the field of electronic information technology, and in particular to a molded circuit board and a camera module, a manufacturing method thereof, and an electronic device comprising the same.

BACKGROUND OF THE INVENTION

As one of the core components of various electronic device, circuit boards can provide mechanical support for fixing and assembling various electronic components such as integrated circuits to realize wiring, electrical connection or electrical insulation between various electronic components. Generally, the circuit board is made into a printed circuit, a printed element or a conductive pattern formed by a combination of the two on an insulating substrate according to a predetermined design. The types of circuit boards usually include single-sided circuit boards, double-sided circuit boards and multi-layer circuit boards. Single-sided circuit boards or double-sided circuit boards are generally formed by etching circuits on copper clad boards with single-sided copper clad or double-sided copper clad (of course, some circuit boards will also use perforation technology). Copper clad boards are formed by compressing the copper foil and the substrate (the substrate is an insulating material) together. Multi-layer circuit boards are usually manufactured by laminating, mainly by compressing multiple circuit layers (currently the circuit layer material is generally copper) and multiple substrates, and then drilling through holes (not shown in the figure) between the circuit layers on the multilayer circuit board to electrically connect each of the circuit layers to form the multilayer circuit board.

At present, whether it is a single-sided circuit board, a double-sided circuit board or a multi-layer circuit board, or a circuit board manufactured by a laminate method or a circuit board manufactured by an additive method, there are usually exposed circuits on the surface, vias, pads and substrates. Therefore, an ink layer is generally provided on the surface of the circuit board by printing, curtaining, spraying or rolling, for solder resisting and insulation (that is, all the circuits and copper surfaces on the circuit board are covered by the ink layer, and the vias and their pads to be soldered on the circuit board are reserved to prevent short circuits when electronic components are soldered, and at the same time to avoid conduction between the circuits) and circuit board protection (that is, all circuits on the circuit board are covered by the ink layer to prevent oxidation of the circuit due to moisture and various dielectrics to harm electrical performance, and to prevent external mechanical damage).

However, as the performance of electronic device becomes higher and higher, the chips mounted on the circuit board will generate more heat, and the ink's heat dissipation performance is relatively poor, which will seriously affect the heat dissipation of the circuit board and the chip. As a result, the performance of electronic device is degraded. Especially for camera modules, the photosensitive chip of the camera module is usually mounted on the circuit board. The existence of the ink layer makes the circuit board's heat dissipation capacity poor, which in turn affects the heat dissipation of the photosensitive chip, which will cause the performance of the camera module severely degraded. In addition, due to the inherent defects in the layout process of the ink layer (printing, curtaining, spraying or rolling, etc.), that is, the surface of the ink layer is not flat, therefore, for electronic device such as camera modules that require the chip to be directly mounted on the circuit board, the ink layer on the circuit board will cause the chip mounting on the circuit board to have problems such as tilting and bending, causing errors in the assembly of the electronic device, resulting in decreasing in the performance of electronic device.

In addition, due to the lack of plastic deformation ability and toughness of the ink layer, the ink layer on the surface of the circuit board is prone to cracking, which will cause dirt to infringe on the circuits on the circuit board, thereby affecting the performance of electronic devices.

SUMMARY OF THE INVENTION

An object of the present invention is to provide a molded circuit board and a camera module, a manufacturing method thereof, and an electronic device comprising the same, which can improve the performance of the camera module and the electronic device.

Another object of the present invention is to provide a molded circuit board, a camera module, and a manufacturing method thereof, and an electronic device comprising the same, and in an example of the present invention, a molded circuit board has good heat dissipation performance, which helps to improve a relatively poor heat dissipation problem of conventional circuit boards.

Another object of the present invention is to provide a molded circuit board, a camera module, and a manufacturing method thereof, and an electronic device comprising the same, and in an example of the present invention, the molded circuit board uses a molded structure to replace an ink layer on the conventional circuit board, which helps to solve problems caused by the inherent defects of the ink layer.

Another object of the present invention is to provide a molded circuit board, a camera module, and a manufacturing method thereof, and an electronic device comprising the same, and in an example of the present invention, a molded layer of the molded structure of the molded circuit board is cured by a molding material with good heat dissipation performance on a surface of a circuit board main body through a molding process, so that the heat dissipation performance of the molded structure is better than that of the ink layer, which is beneficial to strengthen the heat dissipation of the molded circuit board so as to facilitate the improvement of the performance of the camera module and the electronic device.

Another object of the present invention is to provide a molded circuit board, a camera module, and a manufacturing method thereof, and an electronic device comprising the same, and in an example of the present invention, the molded structure can improve a structural strength of the molded circuit board and reduces a bending degree of the molded circuit board.

Another object of the present invention is to provide a molded circuit board, a camera module, and a manufacturing method thereof, and an electronic device comprising the same, and in an example of the present invention, the manufacturing method of the molded circuit board eliminates the layout of ink on the circuit board main body, so that the molded structure can be directly combined with the circuit board main body, which helps to increase a bonding strength between the two.

Another object of the present invention is to provide a molded circuit board, a camera module, and a manufacturing method thereof, and an electronic device comprising the same, and in an example of the present invention, by eliminating the process for providing the ink, the manufacturing method of the molded circuit board is simplified, which helps to reduce the manufacturing cost.

Another object of the present invention is to provide a molded circuit board, a camera module, and a manufacturing method thereof, and an electronic device comprising the same, and in an example of the present invention, the molded circuit board can provide a flat mounting surface with the molded structure, which helps to improve the performance of the camera module and the electronic device.

Another object of the present invention is to provide a molded circuit board, a camera module, and a manufacturing method thereof, and an electronic device comprising the same, and in an example of the present invention, the molded circuit board can avoid the problem of dirt caused by the crack of the ink layer as the conventional circuit board, which helps to improve the protection of the circuit board main body.

Another object of the present invention is to provide a molded circuit board, a camera module, and a manufacturing method thereof, and an electronic device comprising the same, and in an example of the present invention, the molded structure of the molded circuit board can provide a mounting surface for the lens assembly to replace a lens holder or a base in the conventional camera module, which helps to simplify the assembly process of the camera module.

Another object of the present invention is to provide a molded circuit board, a camera module, and a manufacturing method thereof, and an electronic device comprising the same, and in an example of the present invention, the molded structure of the molded circuit board can provide a chip attaching surface and/or a mounting surface with good flatness to avoid the problem of tilting and bending of the chip and the optical lens during mounting process, which helps to ensure that the camera module and the electronic device have better performance.

Another object of the present invention is to provide a molded circuit board, a camera module, and a manufacturing method thereof, and an electronic device comprising the same, and in order to achieve the above-mentioned objects, the present invention does not need to use expensive materials or complicated structures. Therefore, the present invention successfully and effectively provides a solution, which not only provides a simple molded circuit board and camera module, and a manufacturing method thereof, and an electronic device comprising the same, but also improve the practicability and reliability of the molded circuit board and the camera module, and the manufacturing method thereof, and the electronic device comprising the same.

In order to achieve at least one of the above-mentioned objects or other objects and advantages, the present invention provides a method for manufacturing a molded circuit board, which comprises the following step of:
providing a circuit board main body and forming a molded layer of a molded structure by curing an insulating molding material on at least one surface of the circuit board main body with a molding die.

According to an example of the present invention, the step of providing a circuit board main body and forming a molded layer of a molded structure by curing an insulating molding material on at least one surface of the circuit board main body with a molding die comprises the following step of: forming a front molded layer of the molded layer of the molded structure by curing the insulating molding material on a front surface of the circuit board main body with an upper die of the molding die, wherein the front molded layer only covers a front conductive circuit of a front circuit layer of the circuit board main body so that a pad of the front circuit layer is exposed to the outside.

According to an example of the present invention, the step of said forming a front molded layer of the molded layer of the molded structure by curing the insulating molding material on a front surface of the circuit board main body with an upper die of the molding die comprises the following steps of:
placing the circuit board main body on the upper die of the molding die so that an inner surface of the upper die is pressed against the pad of the front circuit layer of the circuit board main body, and forming a front molding space between the inner surface of the upper die and a front surface of the circuit board main body; and
injecting the insulating molding material into the front molding space to form the front molded layer after curing.

According to an example of the present invention, the manufacturing method of the molded circuit board, before the step of placing the circuit board main body on the upper die of the molding die, further comprises the following step of:
etching the front conductive circuit of the front circuit layer of the circuit board main body to reduce a height of the front conductive circuit, so that a surface of the front conductive circuit is lower than a surface of the pad.

According to an example of the present invention, before the step of placing the circuit board main body on the upper die of the molding die, there further comprising the following step of: depositing metal on the pad of the front circuit layer of the circuit board main body by a deposition process to increase a height of the pad so that the surface of the front conductive circuit is lower than the surface of the pad.

According to an example of the present invention, a step of said providing a circuit board main body and forming a molded layer of a molded structure by curing an insulating molding material on at least one surface of the circuit board main body with a molding die comprises the following step of:
forming the front molded layer of the molded layer of the molded structure by curing the insulating molding material on the front surface of the circuit board main body with the upper die of the molding die, wherein the front molded layer only covers a surface of a substrate layer of the circuit board main body so that the front conductive circuit and the pad of the front circuit layer is exposed to the outside; and
correspondingly providing an insulating protection layer on the front conductive circuit of the front circuit layer to cover the front conductive circuit.

According to an example of the present invention, a step of said forming a front molded layer of the molded layer of the molded structure by curing the insulating molding material on the front of the circuit board main body with an upper die of the molding die comprises the following step of:
placing the circuit board main body on the upper die of the molding die, so that an inner surface of the upper die is simultaneously pressed against the front conductive circuit and the pad of the front circuit layer of the circuit board main body, thereby a front molding space is formed between the inner surface of the upper die and a front surface of the circuit board main body; and injecting the insulating molding material into the front molding space to form the front molded layer after curing.

According to an example of the present invention, a step of said providing a circuit board main body and forming a molded layer of a molded structure by curing an insulating molding material on at least one surface of the circuit board main body with a molding die further comprises the following step of:

forming a back molded layer of the molded layer of the molded structure by curing the insulating molding material on a back surface of the circuit board main body with a lower die of the molding die, wherein the back molded layer covers a back conductive circuit of a back circuit layer of the circuit board main body.

According to an example of the present invention, the method for manufacturing a molded circuit board, further comprises the following step of:

mounting a set of electronic components on the pad of the front circuit layer of the circuit board main body.

According to an example of the present invention, a step of said providing a circuit board main body and forming a molded layer of a molded structure by curing an insulating molding material on at least one surface of the circuit board main body with a molding die comprises the following steps of: mounting a set of electronic components on the pads on the front circuit layer of the circuit board main body;

forming a front molded layer and a molded package body of the molded structure by curing the insulating molding material on a front surface of the circuit board main body with an upper die of the molding die, wherein the front molded layer covers a front conductive circuit of the front circuit layer and the molded package body covers the electronic components; and forming a back molded layer of the molded structure by curing the insulating molding material on a back surface of the circuit board main body with a lower die of the molding die, wherein the back molded layer covers a back conductive circuit of a back circuit layer of the circuit board main body to manufacture the molded circuit board.

According to an example of the present invention, the front molded layer only covers the front conductive circuit on the front circuit layer located at an edge area of the circuit board main body.

According to an example of the present invention, heat dissipation efficiency of the insulating molding material is greater than that of the ink material.

According to another aspect of the present invention, the present invention also provides a method for manufacturing a camera module, comprising the following steps of:

manufacturing the molded circuit board according to any one of the above-mentioned methods for manufacturing a molded circuit board;

mounting at least one photosensitive chip to the molded circuit board, and conductively connecting each of the photosensitive chips to the molded circuit board; and correspondingly providing a lens assembly on the molded circuit board, so that each optical lens of the lens assembly is located in the corresponding photosensitive path of the photosensitive chip.

According to an example of the present invention, the method of manufacturing a camera module, further comprises the follow step of:

correspondingly providing a filter assembly between the molded circuit board and the lens assembly, so that light entering from each of the optical lenses is received by the photosensitive chip after passing through a filter element of the filter assembly.

According to another aspect of the present invention, the present invention also provides a method for manufacturing a camera module, comprising the following steps of:

conductively mounting at least one photosensitive chip on a chip mounting area of a circuit board main body, and conductively mounting a set of electronic components on an edge area of the circuit board main body;

forming a front molded layer of a molded layer and a molded package body of a molded structure by curing an insulating molding material on a front surface of the circuit board main body with a molding die, wherein the front molded layer only covers a front conductive circuit on the front circuit layer of the circuit board main body at the edge area of the circuit board main body, and the molded package body covers the electronic component and a non-photosensitive area of the photosensitive chip;

correspondingly providing at least one filter element of a filter assembly on the molded package body, wherein each of the filter elements is located in a corresponding photosensitive path of the photosensitive chip; and correspondingly providing a lens assembly on the molded package body of the molded structure, wherein each optical lens of the lens assembly is located in the corresponding photosensitive path of the photosensitive chip, so that light entering from each of the optical lenses is received by the photosensitive chip after passing through the corresponding filter element.

According to an example of the present invention, the method of manufacturing a camera module, further comprises the following step of:

forming a back molded layer of the molded layer of the molded structure by curing the insulating molding material on a back surface of the circuit board main body with the molding die, wherein the back molded layer covers a back conductive circuit of a back circuit layer of the circuit board main body.

According to another aspect of the present invention, the present invention also provides a molded circuit board, comprising:

a circuit board main body, wherein the circuit board main body includes at least one circuit layer and at least one substrate layer, wherein the circuit layer and the substrate layer are stacked at intervals; and a molded structure, wherein the molded structure includes a molded layer, and the molded layer is stacked on at least one surface of the circuit board main body to cover at least a part of the substrate layer of the circuit board main body.

According to an example of the present invention, the molded layer of the molded structure includes a front molded layer, wherein the front molded layer is stacked on a front surface of the circuit board main body to cover the substrate layer located on the front surface of the circuit board main body.

According to an example of the present invention, the circuit layer of the circuit board main body includes a front circuit layer stacked on a front surface of the substrate layer, wherein the front circuit layer includes a front conductive circuit and a set of pads conductively connected to the front conduction circuit, and the front molded layer further covers the front conductive circuit of the front circuit layer.

According to an example of the present invention, the front molded layer of the molded structure is provided with a groove corresponding to the pads of the front circuit layer to ensure the pads of the front circuit layer expose to the outside while the molded layer covers the front conductive circuit of the front circuit layer of the circuit board main body.

According to an example of the present invention, the circuit layer of the circuit board main body includes a front circuit layer stacked on a front surface of the substrate layer, wherein the front circuit layer includes a front conductive circuit and a set of pads conductively connected to the front conductive circuit, and the molded structure further includes an insulating protection layer, and the insulating protection layer is stacked on the front molded layer, and corresponds to the front conductive circuit of the front circuit layer of the circuit board main body to cover the front conductive circuit.

According to an example of the present invention, a surface of the front conductive circuit of the front circuit layer of the circuit board main body has a same height as a surface of the pad of the front circuit layer.

According to an example of the present invention, a surface of the front conductive circuit of the front circuit layer of the circuit board main body is lower than a surface of the pad of the front circuit layer.

According to an example of the present invention, the molded layer of the molded structure includes a back molded layer, wherein the back molded layer is stacked on a back surface of the circuit board main body to cover the substrate layer located on the back surface of the circuit board main body.

According to an example of the present invention, the circuit layer of the circuit board main body includes a back circuit layer stacked on a back surface of the substrate layer, wherein the back circuit layer includes a back conductive circuit, and the back molded layer covers the back conductive circuit of the back circuit layer.

According to an example of the present invention, the molded circuit board further includes a set of electronic components, wherein each of the electronic components is mounted on the pad of the front circuit layer of the circuit board main body, and the molded structure further includes a molded package body, and the molded package body integrally extends from the front molded layer to cover the electronic component.

According to an example of the present invention, the front molded layer of the molded structure covers the front conduction circuit of the front circuit layer and the substrate layer located at an edge area of the circuit board main body, so that the front conductive circuit of the front circuit layer and the substrate layer located at a chip mounting area of the circuit board main body are exposed to the outside.

According to an example of the present invention, the molded layer of the molded structure is cured by an insulating molding material on at least one surface of the circuit board main body with a molding die.

According to an example of the present invention, a heat dissipation efficiency of the insulating molding material is greater than that of the ink material.

According to another aspect of the present invention, the present invention also provides a camera module, comprising:

a molded circuit board, wherein the molded circuit board includes:

a circuit board main body, wherein the circuit board main body includes at least one circuit layer and at least one substrate layer, and the circuit layer and the substrate layer are stacked at intervals; and a molded structure, wherein the molded structure includes a molded layer, and the molded layer is stacked on at least one surface of the circuit board main body to cover at least a part of the substrate layer of the circuit board main body;

at least one photosensitive chip, wherein each of the photosensitive chips is mounted on the molded circuit board, and each of the photosensitive chips is electrically connected to the molded circuit board; and a lens assembly, wherein the lens assembly includes at least one optical lens, and the lens assembly is correspondingly provided on the molded circuit board, and each of the optical lenses is located in a corresponding photosensitive path of the photosensitive chip.

According to an example of the present invention, the molded layer of the molded structure includes a front molded layer, wherein the front molded layer is stacked on a front surface of the circuit board main body to cover the substrate layer located on the front surface of the circuit board main body.

According to an example of the present invention, the circuit layer of the circuit board main body includes a front circuit layer stacked on a front surface of the substrate layer, wherein the front circuit layer includes a front conductive circuit and a set of pads conductively connected to the front conductive circuit, and the front molded layer further covers the front conductive circuit of the front circuit layer, and each of the photosensitive chips is mounted on the front molded layer.

According to an example of the present invention, the front molded layer of the molded structure is provided with a groove corresponding to the pads of the front circuit layer to ensure the pads of the front circuit layer expose to the outside while the molded layer covers the front conductive circuit of the front circuit layer of the circuit board main body.

According to an example of the present invention, the circuit layer of the circuit board main body includes a front circuit layer stacked on a front surface of the substrate layer, wherein the front circuit layer includes a front conductive circuit and a set of pads conductively connected to the front conductive circuit, and the molded structure further includes an insulating protection layer, and the insulating protection layer is stacked on the front molded layer, and corresponds to the front conductive circuit of the front circuit layer of the circuit board main body to cover the front conductive circuit, and each of the photosensitive chips is mounted on the insulating protection layer.

According to an example of the present invention, the molded layer of the molded structure includes a back molded layer, wherein the back molded layer is stacked on a back surface of the circuit board main body to cover the substrate layer located on the back surface of the circuit board main body.

According to an example of the present invention, the circuit layer of the circuit board main body includes a back circuit layer stacked on a back surface of the substrate layer, wherein the back circuit layer includes a back conduction circuit, and the back molded layer covers the back conductive circuit of the back circuit layer.

According to an example of the present invention, the front molded layer of the molded structure covers the front conductive circuits of the front circuit layer and the substrate layer located at an edge area of the circuit board main body, so that the front conductive circuit of the front circuit layer and the substrate layer located at a chip mounting area of the circuit board main body are exposed to the outside, wherein each of the photosensitive chips is mounted on the chip mounting area of the circuit board main body directly by the adhesive.

According to an example of the present invention, the camera module further includes a set of electronic components, wherein each of the electronic components is mounted on the pad of the front circuit layer of the circuit board main body, and the molded structure further includes a molded package body, and the molded package body integrally extends from the front molded layer to cover the electronic component, and the lens assembly is assembled in the molded package body.

According to an example of the present invention, the molded package body of the molded structure further covers a non-photosensitive area of the photosensitive chip.

According to an example of the present invention, the molded layer of the molded structure is formed by curing an insulating molding material on at least one surface of the circuit board main body with a molding die.

According to an example of the present invention, the insulating molding material is epoxy molding compound.

According to an example of the present invention, the lens assembly further includes at least one driver, wherein each of the optical lenses is assembled in the driver, and each of the drivers is mounted on the molded circuit board to driveably keep each of the optical lenses located in the corresponding photosensitive path of the photosensitive chip.

According to an example of the present invention, the lens assembly further includes at least one lens barrel, wherein each of the optical lenses is assembled in the lens barrel, and each of the lens barrels is mounted on the molded circuit board to keep each of the optical lenses located in the corresponding photosensitive path of the photosensitive chip.

According to an example of the present invention, the lens assembly further includes a light turning mechanism, wherein the light turning mechanism is provided on the photosensitive path of the photosensitive chip for turning the light entering the light turning mechanism, so that the turned light is received by the photosensitive element after passing through the optical lens.

According to an example of the present invention, the camera module further includes a filter assembly, wherein the filter assembly is correspondingly provided between the optical lens and the photosensitive chip, so that the light entering through the optical lens is received by the photosensitive chip after passing through the filter assembly.

According to an example of the present invention, the filter assembly includes at least one filter element and a base, wherein each of the filter elements is assembled on the base, and the base is correspondingly provided on the molded structure of the molded circuit board at a position corresponding to an edge area of the circuit board main body, so that each of the filter elements corresponds to the corresponding photosensitive path of the photosensitive element, and the lens assembly is assembled on the base.

According to an example of the present invention, the base is a bracket base manufactured separately or a molded base manufactured by a molding process.

According to another aspect of the present invention, the present invention also provides an electronic device, comprising:
an electronic device body; and
at least one of the above-mentioned camera modules, wherein each of the camera modules is provided on the electronic device main body for acquiring images.

According to another aspect of the present invention, the present invention also provides an electronic device, wherein the electronic device is configured with at least one of the above-mentioned molded circuit boards.

Through the understanding of the following description and the drawings, the further objectives and advantages of the present invention will be fully embodied.

These and other objectives, features and advantages of the present invention are fully embodied by the following detailed description, drawings and claims.

DETAIL DESCRIPTION OF THE INVENTION

Figure 1:
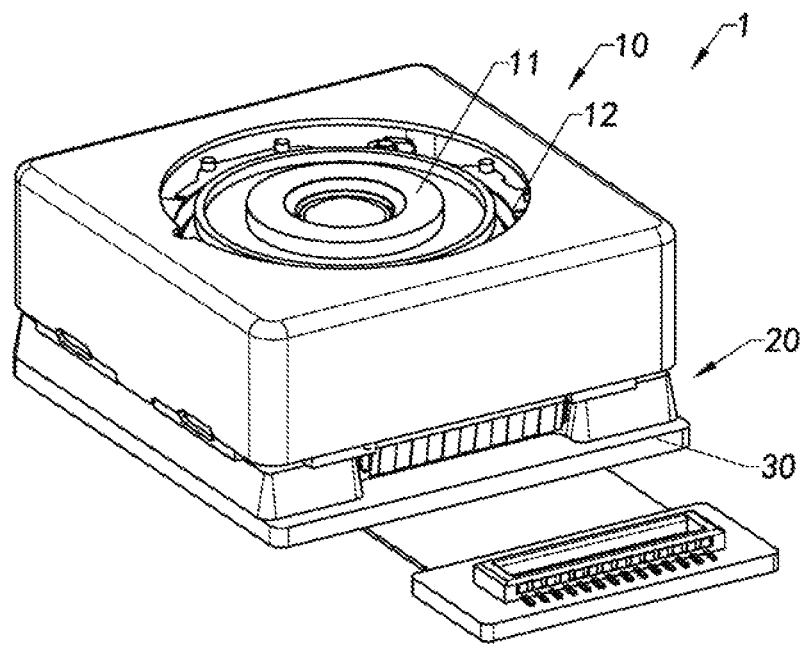
FIG. 1 is a three-dimensional schematic diagram of a camera module according to a first example of the present invention.

The following description is used to disclose the present invention so that those skilled in the art can implement the present invention. The preferred examples in the following description are only examples, and those skilled in the art can think of other obvious variations. The basic principles of the present invention defined in the following description can be applied to other examples, modifications, improvements, equivalents, and other technical solutions that do not depart from the spirit and scope of the present invention.

Those skilled in the art should understand that, in the disclosure of the present invention, the orientation or positional relationship indicated by the terms "longitudinal", "lateral", "upper", "lower", "front", "rear", "left", "right", "vertical", "horizontal", "top", "bottom", "inner", "outer", etc., are based on the orientation or positional relationship shown in the drawings, which is only for the convenience of describing the present invention and simplifying the description, rather than indicating or implying that the device or element referred to must have a specific orientation, be constructed and operated in a specific orientation, and therefore the above-mentioned terms should not be construed as limiting the present invention.

In the present invention, the term "a" in the claims and specification should be understood as "one or more", that is, in one example, the number of an element may be one, and in another example, the number of the element can be more than one. Unless it is clearly stated in the disclosure of the present invention that the number of the element is only one, the term "one" cannot be understood as unique or singular, and the term "one" cannot be understood as a limitation on the number. In the description of the present invention, it should be understood that "first", "second", etc. are only used for descriptive purposes, and cannot be understood as indicating or implying relative importance. In the description of the present invention, it should be noted that unless otherwise clearly specified and limited, the terms "connected" and "connection" should be understood in a broad sense. For example, it can be a fixed connection, a detachable connection or an integral connection; it can be a mechanical connection or an electrical connection; it can be a direct connection or an indirect connection through a medium. For those of ordinary skilled in the art, the specific meanings of the above-mentioned terms in the present invention can be understood according to specific circumstances.

In the description of this specification, descriptions with reference to the terms "one example", "some examples", "examples", "specific examples", or "several examples" etc. mean specific features, structures, materials or characteristics described in conjunction with the example or examples are included in at least one example or examples of the present invention. In this specification, the schematic representations of the above terms do not necessarily refer to the same example or examples. Moreover, the described specific features, structures, materials or characteristics can be combined in any one or more example or examples in a suitable manner. In addition, those skilled in the art can conjunct and combine the different example or examples and the features of the different example or examples described in this specification without contradicting each other.

As an indispensable part of electronic device, circuit boards mainly provide mechanical support for fixing and assembling various electronic components such as integrated circuits. Circuit boards usually include single-sided circuit boards, double-sided circuit boards, and multi-layer circuit boards. Since the surfaces of various circuit boards usually have exposed circuits, vias, pads and substrates, in the prior art, an ink layer is usually provided on the surface of the circuit board by printing, curtaining, spraying or rolling. For example, a layer of ink is first set up by spraying, and then the photosensitive reaction of the photosensitive resist is used to transfer the conductive pattern on the film to the ink on the circuit board, and then ultraviolet rays are irradiated. Because the transparent part except the conductive pattern on the film transmits ultraviolet rays, the corresponding ink on the surface of the circuit board is photopolymerized and changed from monomer to polymer. Finally, the unphotopolymerized ink on the surface of the circuit board is removed by a weak alkali solution so that the copper surface is exposed. Its purpose is to prevent soldering and insulation and protect the circuit board.

However, as the performance of electronic device becomes higher and higher, the chips or other components mounted on the circuit board will generate more heat, and the relatively poor heat dissipation performance of the ink will seriously affect the heat dissipation of the circuit board. As a result, the performance of electronic device is degraded. Especially for camera modules, the photosensitive chip of the camera module is usually directly mounted on the circuit board. Due to the existence of the ink layer, the heat dissipation capacity of the circuit board is poor, which in turn affects the heat dissipation of the photosensitive chip, which will lead to the performance of the camera module being severely degraded. In addition, due to the inherent defects in the layout process of the ink layer (printing, curtaining, spraying or rolling, etc.), that is, the surface of the ink layer is not flat, so for the electronic devices that is necessary to directly mount the chip on the circuit board like a camera module, the ink layer on the circuit board may cause problems such as tilting and bending of the chip mounting on the circuit board, causing errors in the assembly of the electronic device, and reducing the performance of the electronic device. Therefore, in order to solve the above-mentioned problems, the present invention provides a molded circuit board and a manufacturing method thereof, which can improve the heat dissipation performance and/or flatness of the circuit board, and help to improve the performance of the various electronic devices equipped with the molded circuit board.

It is worth mentioning that although the circuit board of the camera module is taken as an example in FIGS. 1 to 8B and the following description to illustrate the features and advantages of the molded circuit board of the present invention, those skilled in the art can understood that the molded circuit board disclosed in FIGS. 1 to 8B and the following description is only an example, and does not constitute a limitation to the content and scope of the present invention. For example, in other examples of the molded circuit board, the molded circuit board can also be used for other electronic devices such as e-books, AR glasses, robots, computers, etc., which will not be described in the present invention.

Figure 2:
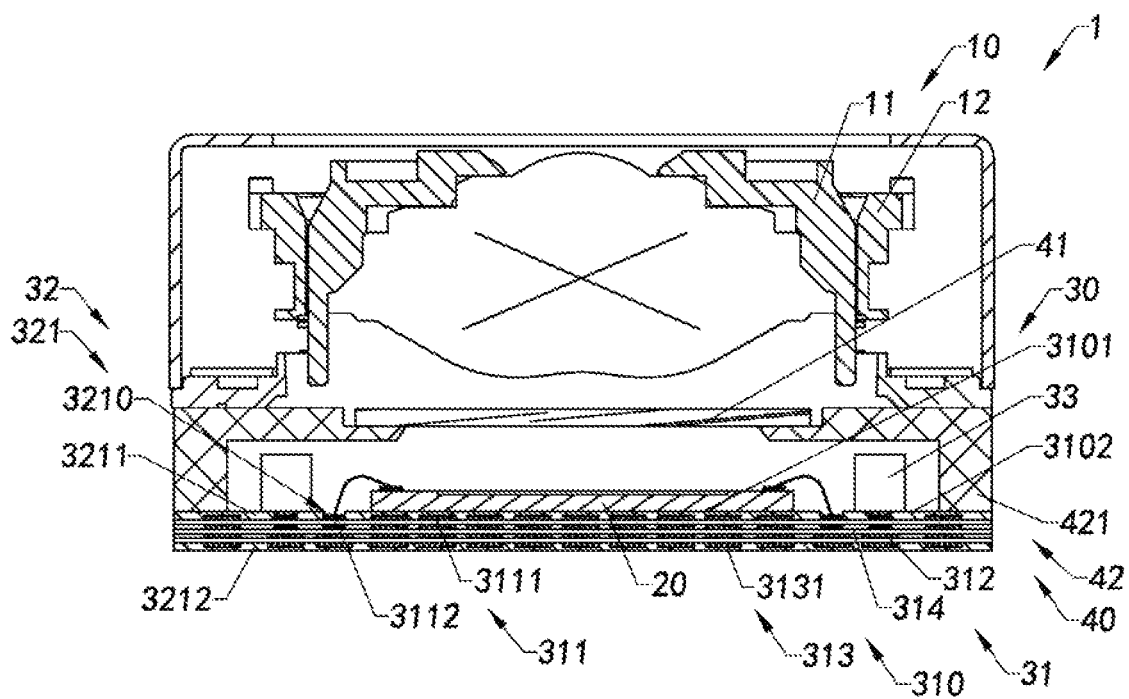
FIG. 2 shows a schematic cross-sectional view of the camera module according to the above-mentioned first example of the present invention.

As shown in FIGS. 1 to 3B of the accompanying drawings of the specification, a molded circuit board, a manufacturing method thereof, and a camera module according to an example of the present invention are illustrated. Specifically, as shown in FIGS. 1 and 2, the camera module 1 includes a lens assembly 10, at least one photosensitive chip 20, and a molded circuit board 30, wherein each of the photosensitive chips 20 is mounted on the molded circuit board 30, and each of the photosensitive chips 20 is electrically connected to the molded circuit board 30. And, the lens assembly 10 includes at least one optical lens 11, wherein the lens assembly 10 is correspondingly provided on the molded circuit board 30, and each of optical lenses 11 is located in the corresponding photosensitive path of the photosensitive chip 20 to be assembled into the camera module 1.

Figure 3A:
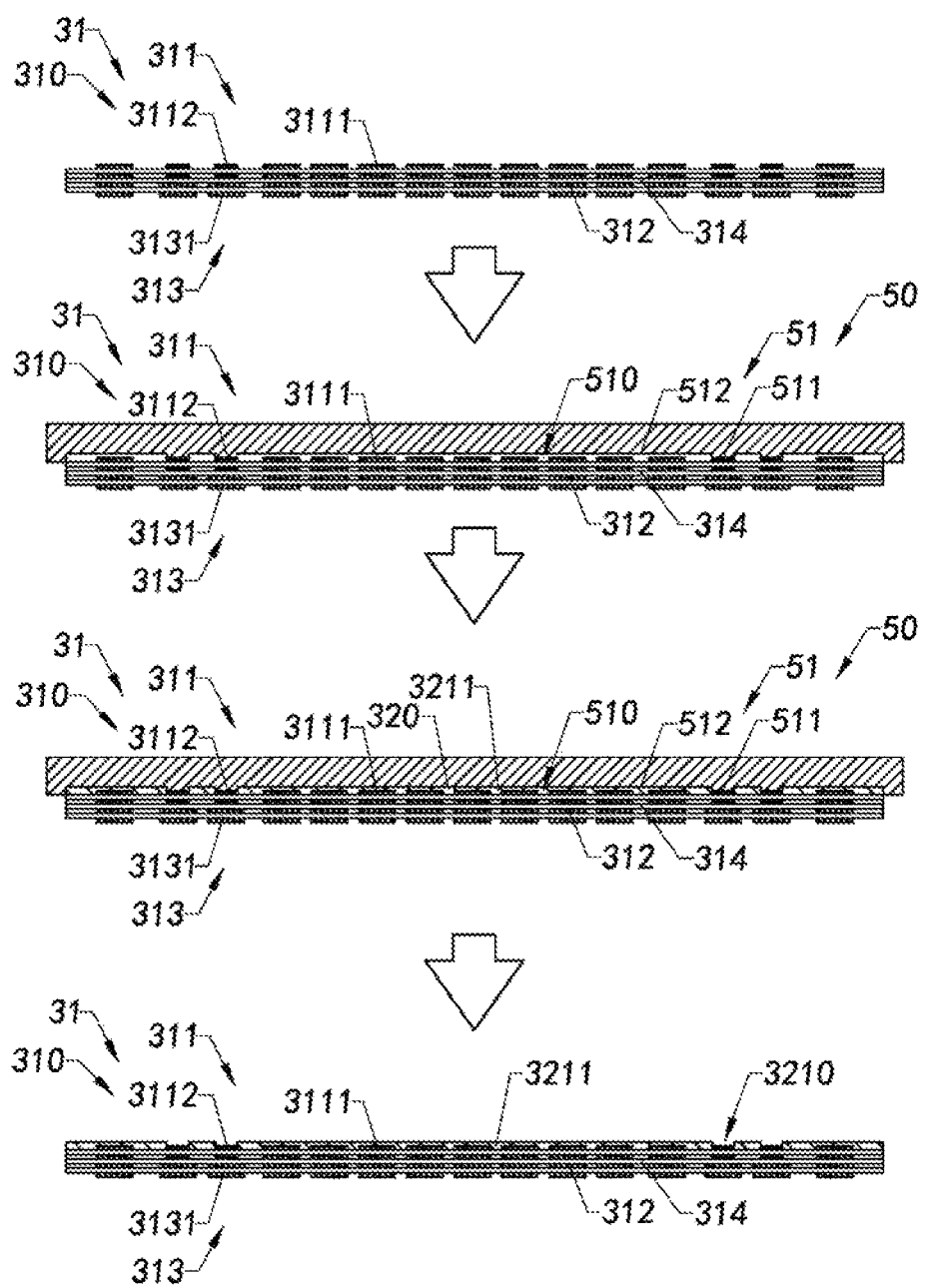
FIG. 3A shows a schematic diagram of one manufacturing processes of the molded circuit board according to the above-mentioned first example of the present invention.

In particular, as shown in FIGS. 2 and 3A, the molded circuit board 30 includes a circuit board main body 31 and a molded structure 32, wherein the circuit board main body 31 includes at least one circuit layer 310 and at least one substrate layer 314, and the circuit layer 310 and the substrate layer 314 are stacked at intervals. And, the molded structure 32 includes a molded layer 321, wherein the molded layer 321 is stacked on at least one surface of the circuit board main body 31 to cover at least a part of the substrate layer 314 of the circuit board main body 31. It is understandable that the substrate layer 314 of the circuit board main body 31 can be, but not limited to, made of polyimide film (PI film for short) or polypropylene (PP for short).

Specifically, the molded layer 321 of the molded structure 32 is formed by curing the insulating molding material 320 on at least one surface of the circuit board main body 31 with a molding die. It is understandable that since the molded structure 32 is directly integrally formed on the surface of the circuit board main body 31 through a molding process, the molded structure 32 can not only improve the flatness of the circuit board main body 31, in order to provide a higher flatness of the chip mounting surface, and but also can be directly combined with the circuit board main body 31, increase a bonding strength between the two, prevent the molded structure 32 from loosening or falling off, and help to extend the service life of the molded structure 32.

It is worth noting that, in the invention, the thickness of the molded layer 321 of the molded structure 32 is between 10 μm and 100 μm. Preferably, the thickness of the molded layer 321 of the molded structure 32 is between 10 μm and 50 μm. It is understandable that the thickness of the circuit layer 310 of the circuit board main body 31 is usually between 10 μm and 50 μm (generally about 25 μm), and the thickness of an ink layer in a conventional circuit board is also about 25 μm.

Preferably, the heat dissipation efficiency of the insulating molding material 320 is greater than the heat dissipation efficiency of an ink material, so that the heat dissipation performance of the molded circuit board 30 is better than that of the circuit board provided with the ink layer, which helps to improve the overall heat dissipation performance of the camera module 1.

More preferably, the insulating molding material 320 is implemented as epoxy molding compound (abbreviation: EMC), which enables the molded circuit board 30 to avoid the problem of dirt caused by the crack of the ink layer as in the conventional circuit board, which helps to improve the protection of the circuit board main body. It is understandable that, since the heat dissipation efficiency of EMC is usually 1 W to 3 W, and the heat dissipation efficiency of ink materials is usually only 0.2 W, compared with conventional ink circuit boards, the heat dissipation performance of the molded circuit board 30 of the present invention is better, which is conducive to meeting the current high-performance development needs of electronic device. Of course, in other examples of the present invention, the insulating molding material 320 can also be implemented as other insulating molding materials with good heat dissipation performance, as long as its heat dissipation efficiency is better than that of the ink material, the present invention will not describe it here.

It is worth mentioning that although in FIGS. 1 to 5D and the following description, taking the camera module 1 including only one optical lens 11 and one photosensitive chip 20 as an example, the features and advantages of the camera module 1 of the present invention are described, those skilled in the art can understand that the camera module 1 disclosed in FIGS. 1 to 5D and the following description is only an example, which does not constitute a limitation to the content and scope of the present invention. For example, in other examples of the camera module, the number of the optical lens 11 and the photosensitive chip 20 may be multiple respectively to form an array camera module. In addition, the type of the optical lens 10 can be adjusted accordingly according to the requirements of the camera module. For example, the optical lens 10 can be implemented as an integrated optical lens, a split optical lens, a bare lens, or an optical lens with a lens barrel, etc., the present invention does not limit thereto. The type of the circuit board main body 31 of the molded circuit board 30 can be adjusted accordingly according to the requirements of the camera module.

For example, in this example of the present invention, the circuit board main body 31 can be implemented as multi-layer circuit board. In other examples of the present invention, the circuit board main body 31 may also be implemented as other types of circuit boards such as single-sided circuit boards or double-sided circuit boards.

Exemplarily, as shown in FIGS. 2 and 3A, in this example of the present invention, the circuit layer 310 of the circuit board main body 31 of the molded circuit board 30 includes a front circuit layer 311, at least one middle circuit layer 312 and a back circuit layer 313, wherein all of the substrate layers 314 are stacked and provided, and the front circuit layer 311 and the back circuit layer 312 are respectively stacked on the outermost side of the substrate layer 314, and each of the middle circuit layers 312 is respectively stacked between the adjacent substrate layers 314 to form the circuit board main body 31 by pressing. It can be understood that, the front circuit layer 311, the middle circuit layer 312, and the back circuit layer 313 may be electrically connected to each other through vias (not shown in the figure) provided on the circuit board main body 31, but they are not limited thereto.

Of course, the circuit board main body 31 can also be formed by superimposing one front circuit layer 311 and one substrate layer 314 on each other to serve as a single-sided circuit board; or, the circuit board main body 31 can also be formed by superimposing one front circuit layer 311, one substrate layer 314, and one back circuit layer 313 on each other to serve as a double-sided circuit board.

It is worth noting that the present invention defines the front circuit layer 311, the middle circuit layer 312, and the back circuit layer 313 according to different positions of the circuit layer 310 in the circuit board main body 31, for example, the circuit layer 310 located on the front surface of the circuit board main body 31 is defined as the front circuit layer 311, the circuit layer 310 located in the middle of the circuit board main body 31 is defined as the middle circuit layer 312, and the circuit layer 310 on the back surface of the circuit board main body 31 is defined as the back circuit layer 313. It can be understood that, in the present invention, the surface of the circuit board main body 31 for attaching the photosensitive chip 20 is defined as the front surface of the circuit board main body 31 (the upper surface of the circuit board main body 31 in FIG. 2); and the surface of the circuit board main body 31 opposite to the surface on which the photosensitive chip 20 is attached is defined as the back surface of the circuit board main body 31 (as shown in FIG. 2, the lower surface of the circuit board main body 31).

Further, in this example of the present invention, as shown in FIGS. 2 and 3A, the front circuit layer 311 of the circuit board main body 31 of the molded circuit board 30 includes a front conductive circuit 3111 and a set of pads 3112, wherein each of the pads 3112 is conductively connected to the front conductive circuit 3111; the back circuit layer 313 only includes a back conductive circuit 3131, and does not include any pads. In other words, in this example of the present invention, all the pads are concentrated on the front surface of the circuit board main body 31, so that various electronic components and the photosensitive chip 20 can only be provided on the front surface of the circuit board main body 31, which is beneficial to reduce the height of the molded circuit board 30, thereby reducing the overall height of the camera module 1. Of course, in other examples of the present invention, the back circuit layer 313 may also include pads for soldering various electronic components, which will not be described in the present invention.

It is worth noting that, as shown in FIG. 2, the circuit board main body 31 has a chip mounting area 3101 and an edge area 3102, wherein the edge area 3102 is located around the chip mounting area 3101, and the pad 3112 is located in the edge area 3102 of the circuit board main body 31. In this way, when the photosensitive chip 20 is mounted on the chip mounting area 3101 of the circuit board main body 31 of the molded circuit board 30, the photosensitive chip 20 can be electrically connected to the pad 3112 through wires, so as to conduct the photosensitive chip 20 and the molded circuit board 30. Of course, in other examples of the present invention, when the pad of the photosensitive chip 20 is located on the non-photosensitive surface of the photosensitive chip 20 (for example, the back surface of the photosensitive chip 20), the pad 3112 of the front circuit layer 311 may also be located in the chip mounting area 3101 of the circuit board main body 31, which will not be described in the present invention.

Preferably, the surface of the front conductive circuit 3111 of the front circuit layer 311 is flush with the surface of the pad 3112 of the front circuit layer 311. For example, the front conductive circuits 3111 and the pads 3112 of the front circuit layer 311 of the circuit board main body 31 are etched through a complete piece of copper foil to ensure the surface of the front conductive circuits 3111 has a same height as the surface of the pad 3112. Of course, in other examples of the present invention, the front conductive circuit 3111 and the pad 3112 can also be manufactured by other processes, and the present invention will not describe it here.

According to the above-mentioned example of the present invention, as shown in FIG. 3A, the molded layer 321 of the molded structure 32 of the molded circuit board 30 includes a front molded layer 3211, wherein the front molded layer 3211 is stacked on the front surface of the circuit board main body 31 to cover the substrate layer 314 on the front surface of the circuit board main body 31. In particular, the front molded layer 3211 can simultaneously cover the surface of the front conductive circuit 3111 of the front circuit layer 311 (that is, the front molded layer 3211 simultaneously covers the conductive circuits 3111 of the chip mounting area 3101 and the edge area 3102 of the circuit board main body 31) and the surface of the substrate layer 314 on the front surface of the circuit board main body 31, and the front molded layer 3211 does not cover the surface of the pad 3112 of the front circuit layer 311.

In other words, the molded layer 321 of the molded structure 32 of the molded circuit board 30 includes the front molded layer 3211 formed by curing the insulating molding material 320 on the front surface of the circuit board main body 31 through a molding process, wherein the surface of the pad 3112 of the front circuit layer 311 is exposed because it is not covered by the front molded layer 3211, and the surface of the front conductive circuit 3111 of the front circuit layer 311 and the surface of the substrate layer 314 on the front surface of the circuit board main body 31 are protected by being covered by the front molded layer 3211. It is understandable that it is precisely because the pad 3112 is exposed to the outside and the front conductive circuit 3111 is covered by the front molded layer 3211, the front molded layer 3211 of the molded structure 32 can perfectly replace the ink layer to prevent soldering and insulation and protect the circuit board. At the same time, since the heat dissipation efficiency of the insulating molding material 320 used in the molding process of the front molded layer 3211 is greater than that of the ink material, the front molded layer 3211 can also improve the heat dissipation performance of the molded circuit board 30.

At the time of manufacturing the molded circuit board 30, one of the circuit board main bodies 31 can be put into a molding die 50 for a molding process, so that the front molded layer 3211 of the molded structure 32 is formed by curing the insulating molding material 320 on the front surface of the circuit board main body 31, wherein the front molded layer 3211 covers the surface of the front conductive circuit 3111 of the front circuit layer 311 and the surface of the substrate layer 314 located on the front surface of the circuit board main body 31, and the pad 3112 is exposed to the outside, and is electrically connected to various electronic components and chips.

Specifically, as shown in FIG. 3A, the molding die 50 includes an upper die 51, wherein the upper die 51 can be moved to perform clamping and drafting operations, and when the molding die 50 is in a mold clamping state, a front molding space 510 is formed between the upper die 51 and the front surface of the circuit board main body 31, wherein the front molded layer 3211 of the molded structure 32 is formed by adding the insulating molding material into the front molding space 510 and curing it. It can be understood that the height of the front molding space 510 of the molding die 50 is between 10 micrometers and 100 micrometers. Preferably, the height of the front molding space 510 of the molding die 50 is between 10 μm and 50 μm, so as to mold the front molded layer 321 that meets the thickness requirement.

More specifically, as shown in FIG. 3A, the upper die 51 of the molding die 50 has a pressing surface 511 and an upper molded surface 512, wherein the pressing surfaces 511 of the upper die 51 correspond to the pad 3112 of the front circuit layer 311 of the circuit board main body 31, and the pressing surface 511 of the upper die 51 is lower than the upper molded surface 512 of the upper die 51 (that is, the upper die 51 has a stepped inner surface), so that when the pressing surface 511 of the upper die 51 is pressed against the corresponding pad 3112, there is still a gap between the upper molded surface 512 of the upper die 51 and the front conductive circuit 3111 to ensure that the insulating molding material 320 can enter the gap between the upper molded surface 512 of the upper die 51 and the front conductive circuit 3111, which enables the cured front molded layer 3211 to cover the front conductive circuit 3111 to protect the front conductive circuit 3111.

Exemplarily, as shown in FIG. 3A, after placing the circuit board main body 31 on the upper die 51, the upper die 51 is operated for clamping, so that the pressing surface 511 of the upper die 51 is pressed on the surface of the pad 3112, and the front molding space 510 is formed between the upper molded surface 512 of the upper die 51 and the surfaces of the front conductive circuit 3111 of the front circuit layer 311 and the substrate layer 314; then, the insulating molding material 320 is injected into the front molding space 510 to form, after curing, the front molded layer 3211 that simultaneously covers the front conductive circuit 3111 and the substrate layer 314, thereby making the molded circuit board 30 (or semi-finished molded circuit board); finally, after the insulating molding material 320 is cured to form the front molded layer 3211, the upper die 51 is operated for drafting, and the molded circuit board 30 (or semi-finished molded circuit board) is taken out from the molding die 50.

It is worth noting that, as shown in FIG. 3A, it is precisely because the pressing surface 511 of the upper die 51 presses the surface of the pad 3112 during the molding process, the insulating molding material 320 cannot cover the surface of the pad 3112, a groove 3210 is formed on the front molded layer 3211 formed by curing the insulating molding material 320 at a position corresponding to the pad 3112, so that the surface of the pad 3112 is exposed, so that various electronic components are electrically connected to the molded circuit board 30. In particular, when electronic components are soldered to the pad 3112 to be electrically connected to the molded circuit board 30, since there is the groove 3210 on the front molded layer 3211 at the position corresponding to the pad 3112, it can effectively prevent the molten solder from flowing out. Therefore, the molded structure 32 can avoid the waste of resources due to the molten solder flowing out while improve the structural strength and heat dissipation performance of the molded circuit board 30. It also helps to improve the soldering performance at the pad 3112.

In addition, since the front molded layer 3211 is integrally formed by a molding process, the front molded layer 3211 can provide a flat chip mounting surface for mounting the photosensitive chip 20 in order to reduce the possibility of tilting or bending of the mounting of the photosensitive chip 20, which helps to reduce mounting errors and improve the performance of the camera module 1. Even for a large-sized photosensitive chip, the front molded layer 3211 can control the mounting error of the chip within a controllable range, so as to ensure that the camera module 1 has a higher performance.

Figure 4A:
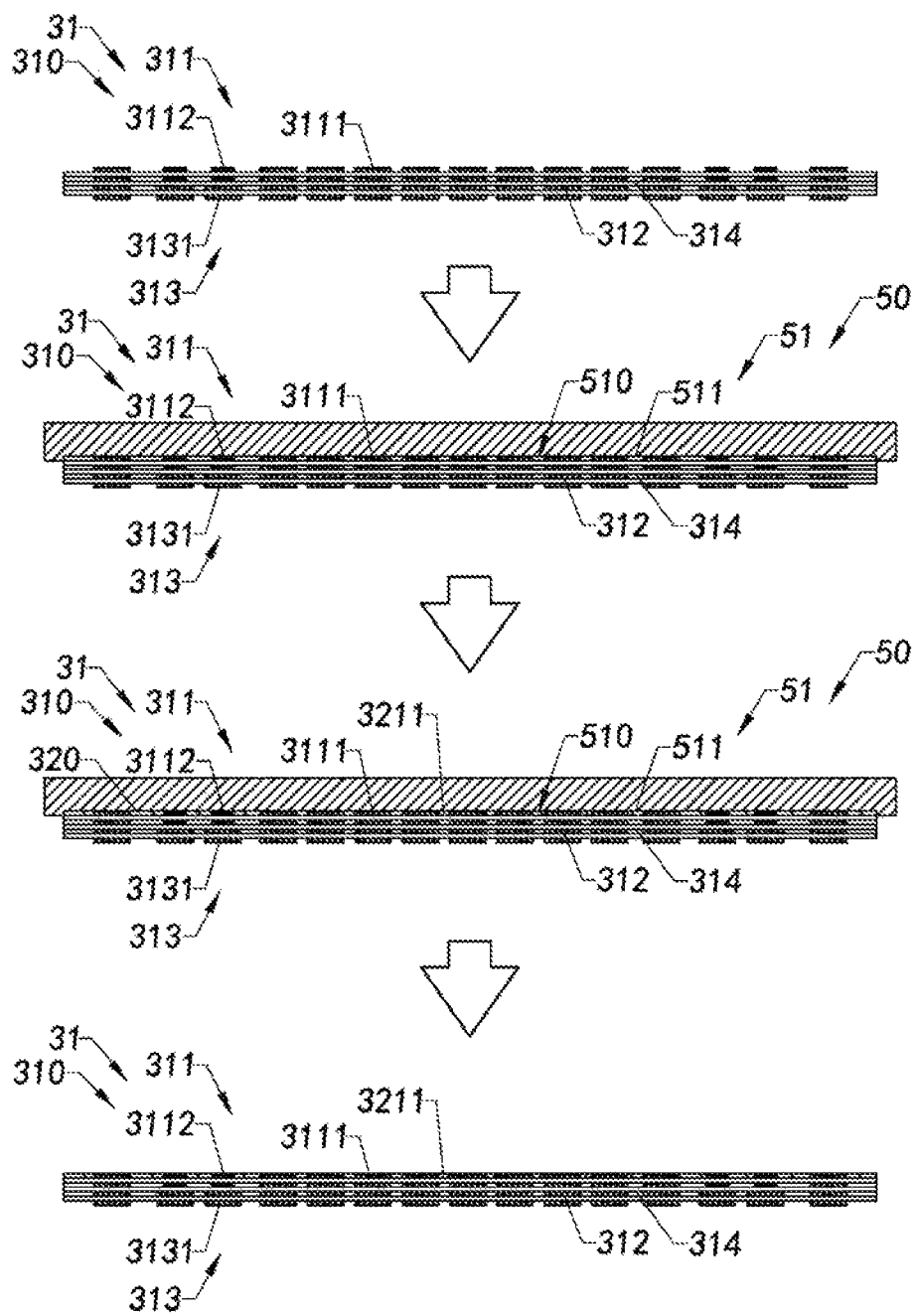
FIG. 4A shows a first modified implementation of the molded circuit board according to the above-mentioned first example of the present invention.

FIG. 4A shows a first modified implementation of the molded circuit board 30 of the camera module 1 according to the above-mentioned example of the present invention. Compared with the above-mentioned example according to the present invention, the molded circuit board 30 according to the first modified implementation e of the present invention is different in that: the front molded layer 3211 of the molded structure 32 only covers the surface of the substrate layer 314 of the circuit board main body 31, and does not cover the front conductive circuit 3111 and the pad 3112 of the front circuit layer 311, that is, the front conductive circuit 3111 and the pad 3112 of the circuit layer 311 are both exposed to the outside.

Specifically, as shown in FIG. 4A, the upper die 51 of the molding die 50 only has a pressing surface 511 (that is, the upper die 51 has a flat inner surface), so that, when the pressing surface 511 of the upper die 51 is pressed against the pad 3112, there is no gap between the pressing surface 511 of the upper die 51 and the front conductive circuit 3111, so that the cured front molded layer 3211 only covers the surface of the substrate layer 314 of the circuit board main body 31, thereby the front conductive circuit 3111 and the pad 3112 of the front circuit layer 311 are both exposed to the outside.

Illustratively, as shown in FIG. 4A, after placing the circuit board main body 31 on the upper die 51, the upper die 51 is operated for clamping, so that the pressing surface 511 of the upper die 51 simultaneously press on the surface of the pad 3112 and the surface of the front conductive circuit 3111, and the front molding space 510 is formed between on the pressing surface 511 of the upper die 51 and the surface of the substrate layer 314 of the circuit board main body 31; then, the insulating molding material 320 is injected into the front molding space 510 to form the front molded layer covering only the surface of the substrate layer 314 after curing; finally, after the insulating molding material 320 is cured to form the front molded layer 3211, the upper die 51 is operated for drafting; the molded circuit board 30 is taken out from the molding die 50.

Figure 4B:
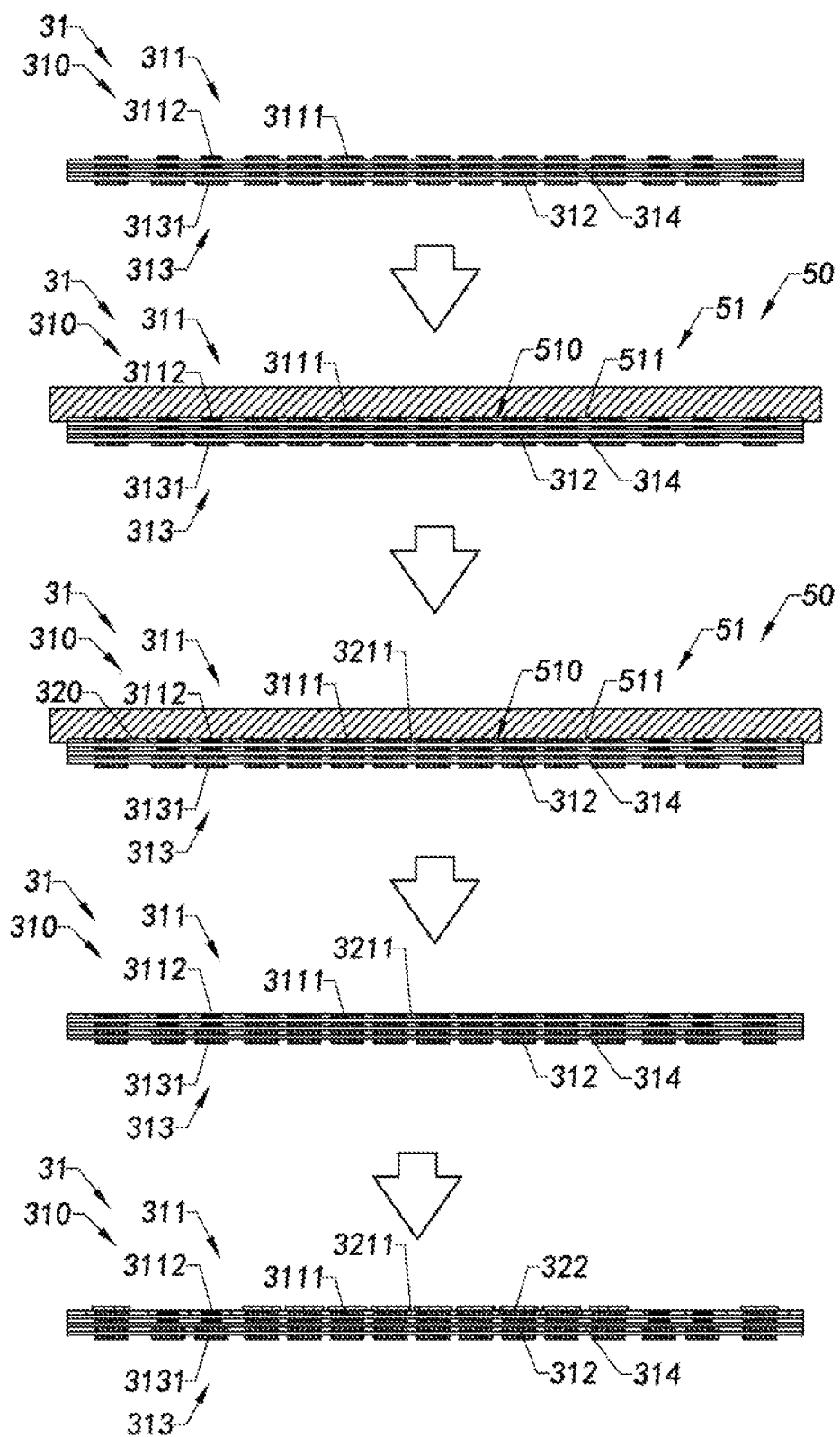
FIG. 4B shows a second modified implementation of the molded circuit board according to the above-mentioned first example of the present invention.

It is worth noting that in this first modified implementation of the present invention, since the front conductive circuit 3111 of the front circuit layer 311 of the circuit board main body 31 is still exposed outside the front molded layer 3211, there is still the risk of mechanical damage and short circuit to the front conductive circuit 3111. Therefore, in order to solve this problem, the present invention further provides the second modified implementation of the molded circuit board 30 on the basis of the above-mentioned first modified implementation. Specifically, as shown in FIG. 4B, the molded structure 32 further includes an insulating protective layer 322, wherein the insulating protective layer 322 is correspondingly provided on the surface of the front conductive circuit 3111 of the front circuit layer 311 to cover the front conductive circuit 3111, so as to prevent the front conductive circuit 3111 from being mechanically damaged or short-circuited.

Preferably, the insulating protection layer 322 of the molded structure 32 is formed by curing an insulating molding material on the exposed surface of the front conductive circuit 311 through a molding process after the front molded layer 3211 is formed, to further cover the exposed surface of the front conductive circuit 311 by the insulating protective layer 322. Of course, in other examples of the present invention, the insulating protection layer 322 may also be provided on the exposed surface of the front conductive circuit 311 by means such as pasting, gluing, or applying.

Figure 4C:
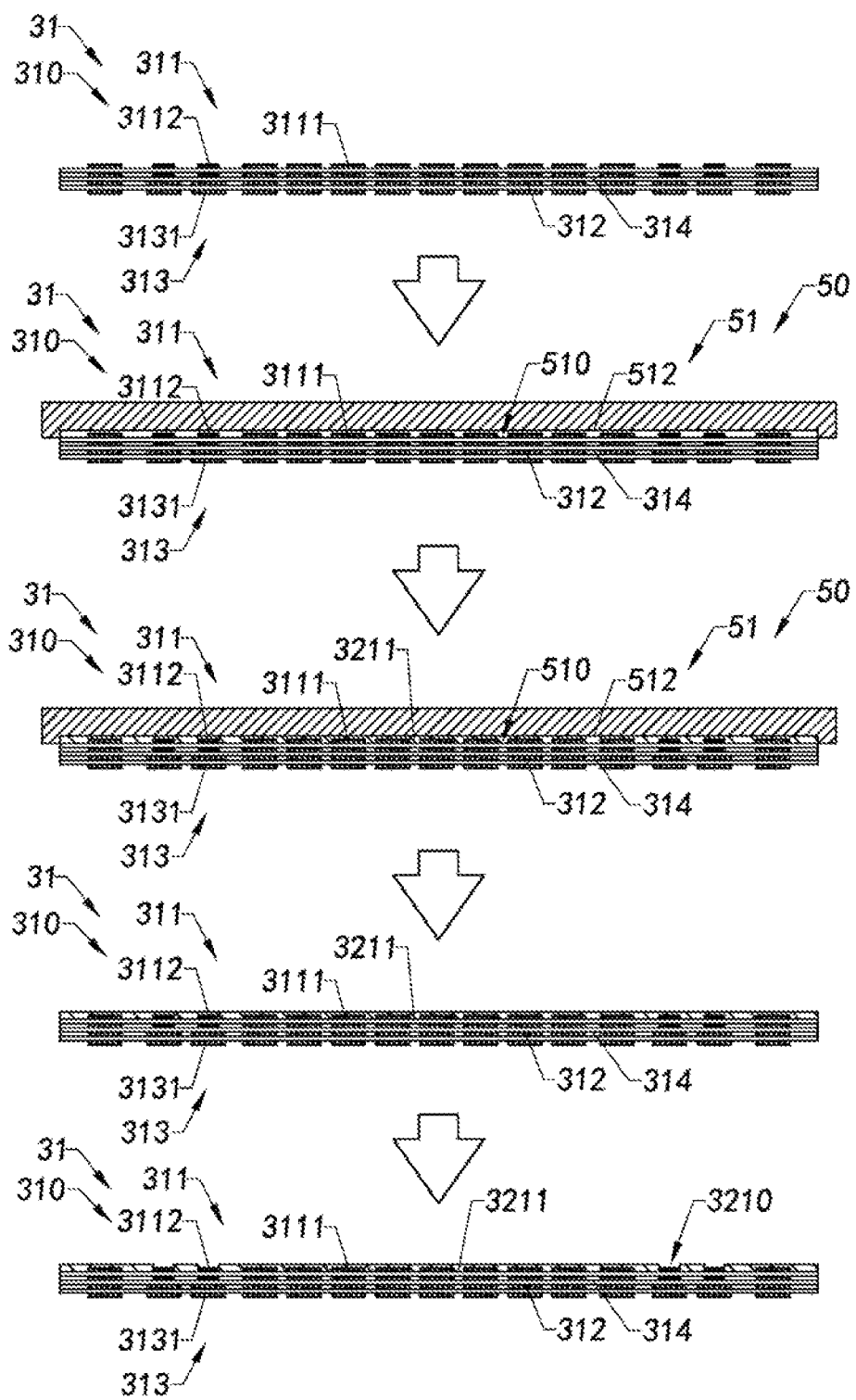
FIG. 4C shows a third modified implementation of the molded circuit board according to the above-mentioned first example of the present invention.

FIG. 4C shows a third modified implementation of the molded circuit board 30 of the camera module 1 according to the above-mentioned example of the present invention. Compared with the above-mentioned example according to the present invention, the molded circuit board 30 according to the third modified implementation of the present invention is different in that: when manufacturing the molded circuit board 30, the upper die 51 of the molding die 50 only has an upper molded surface 512 (that is, the upper die 51 has a flat inner surface), and when the molding die 50 is in a clamp state, the upper molded surface 512 of the upper die 51 does not contact the front conductive circuit 3111 and the pad 3112 of the front circuit layer 311, so that the cured front molded layer 3211 simultaneously covers the surface of the substrate layer 314 of the circuit board main body 31 and the front conductive circuit 3111 and the pad 3112 of the front circuit layer 311.

After that, the front molded layer 3211 is thinned by grinding or the like, so that the front molded layer 3211 forms the groove 3210 at a position corresponding to the pad 3112, so that the pad 3112 of the front circuit layer 311 is exposed to the outside.

Illustratively, as shown in FIG. 4C, first, after placing the circuit board main body 31 on the upper die 51, the upper die 51 is operated for clamping, so that the upper molded surface 512 of the upper die 51 does not press against the front conductive circuit 3111 and the pad 3112 of the front circuit layer 311, so that the front molding space 510 is formed between the inner surface of the upper die 51 and the front surface of the circuit board main body 31; then, the insulating molding material 320 is injected into the front molding space 510 to form the front molded layer 3211 covering the front conductive circuit 3111 and the pad 3112 of the front circuit layer 311 of the circuit board main body 31 after curing to made into the semi-finished molded circuit board; then, after the insulating molding material 320 is cured to form the front molded layer 3211, the upper die 51 is operated for drafting, and the semi-finished molded circuit board is taken out from the molding die 50; finally, the groove 3210 is formed on the front molded layer 3211 at a position corresponding to the pad 3112 by grinding, so that the molded circuit board 30 is manufactured. Of course, in other examples of the present invention, the front molded layer 3211 may also be thinned by grinding, so that the front conductive circuits 3111 and the pads 3112 of the front circuit layer 311 are exposed to the outside.

It is worth noting that the inner surface of the upper die 51 does not press against the front conductive circuit 3111 and the pad 3112 of the front circuit layer 311, so that a distance between an inner surface of the upper die 51 and the front surface of the circuit board main body 31 is increased, so the front molding space 510 becomes larger, so that the insulating molding material 320 can flow more easily to fill the front molding space 510, which helps to complete the molding process.

Figure 4D:
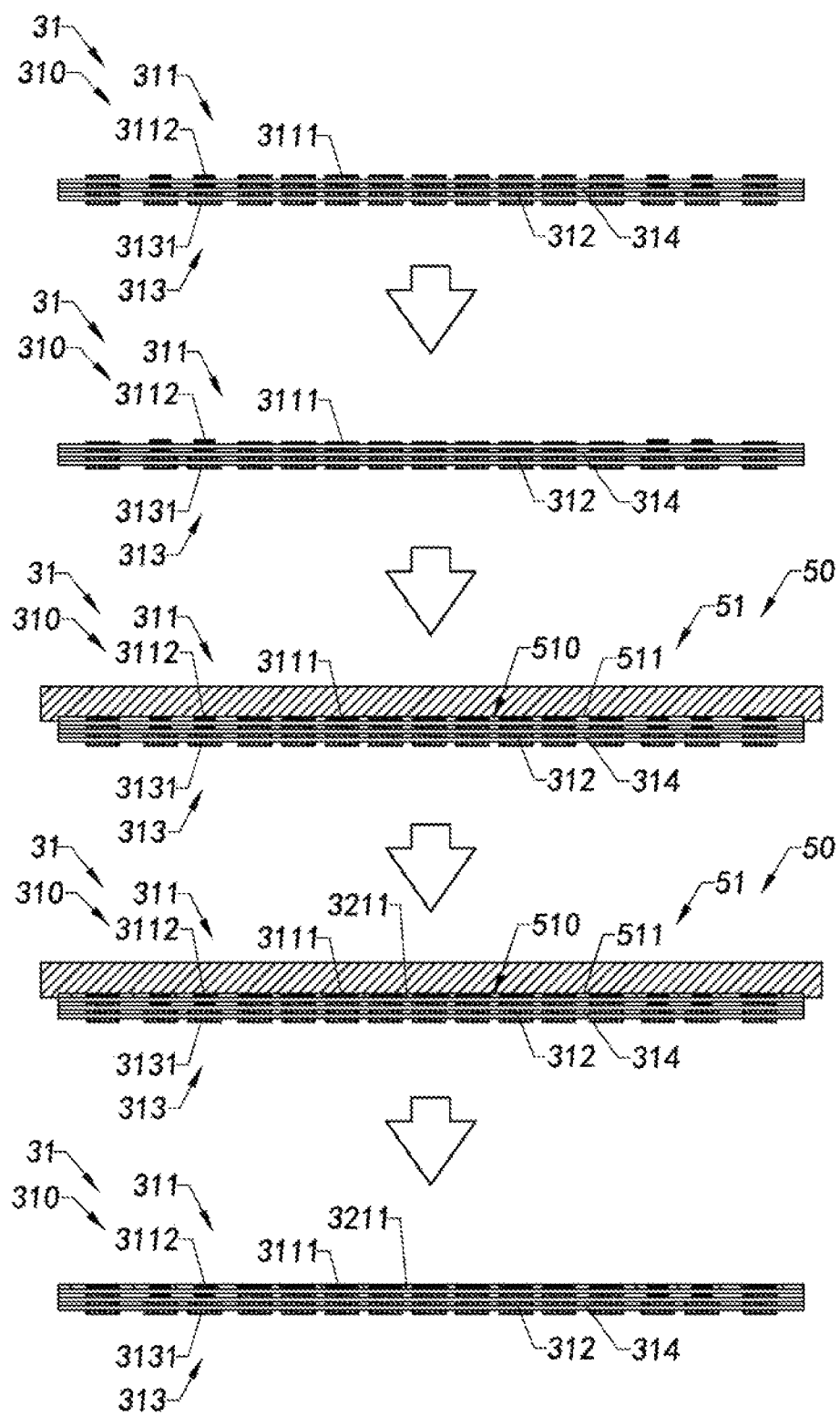
FIG. 4D shows a fourth modified implementation of the molded circuit board according to the above-mentioned first example of the present invention.

FIG. 4D shows a fourth modified implementation of the molded circuit board 30 of the camera module 1 according to the above-mentioned example of the present invention. Compared with the above-mentioned example according to the present invention, the molded circuit board 30 according to the fourth modified implementation of the present invention is different in that: the surface of the front conductive circuit 3111 of the front circuit layer 311 of the circuit board main body 31 is lower than the surface of the pad 3112 of the front circuit layer 311, that is, the height of the front conductive circuit 3111 is smaller than that of the height of the pad 3112, so that when the front conductive circuit 3111 of the front circuit layer 311 is covered by the front molded layer 3211, the pad 3112 of the front circuit layer 311 can still be exposed to the outside.

Specifically, as shown in FIG. 4D, at the time of manufacturing the molded circuit board 30, the front conductive circuit 3111 of the front circuit layer 311 is etched first through an etching process, so as to reduce the height of the front conductive circuit 3111 of the front circuit layer 311, so that the height of the front conductive circuit 3111 is smaller than the height of the pad 3112; then, the front molded layer 3211 is formed on the front surface of the circuit board main body 31 with the molding die 50 through a molding process, so that the front conductive circuit 3111 of the front circuit layer 311 is covered by the front molded layer 3211, and the pad 3112 of the front circuit layer 311 can still be exposed to the outside. Of course, in other examples of the present invention, when the molded circuit board 30 is manufactured, metal can also be deposited on the pad 3112 of the front circuit layer 311 through a deposition process to increase the height of the pad 3112 of the front circuit layer 311, so that the height of the pad 3112 is greater than the height of the front conductive circuit 3111; and then, the front molded layer 3211 is formed on the front surface of the circuit board main body 31 by a molding process with a molding die, so that the front conductive circuit 3111 of the front circuit layer 311 is covered by the front molded layer 3211, and the pad 3112 of the front circuit layer 311 can still be exposed to the outside.

Exemplarily, as shown in FIG. 4D, first, the front conductive circuit 3111 of the front circuit layer 311 of the circuit board main body 31 is etched to reduce the height of the front conductive circuit 3111, so that the surface of the front conductive circuit 3111 is lower than the surface of the pad 3112; then, after placing the etched circuit board main body 31 on the upper die 51, the upper die 51 is operated for clamping, so that the pressing surface 511 of the upper die 51 is pressed against the surface of the pad 3112, and there is still a gap between the pressing surface 511 of the upper die 51 and the surface of the front conductive circuit 3111 to form the molding space 510 between the pressing surface 511 of the upper die 51 and the surface of the substrate layer 314 of the circuit board main body 31 and the surface of the front conductive circuit 3111; next, the insulating molding material 320 is injected into the front molding space 510 to form the front molded layer 3211 covering only the surface of the substrate layer 314 and the surface of the front conductive circuit 3111 after curing to manufacture the molded circuit board 30; finally, after the insulating molding material 320 is cured to form the front molded layer 3211, the upper die 51 is operated for drafting, the molded circuit board 30 is taken out from the molding die 50.

Figure 4E:
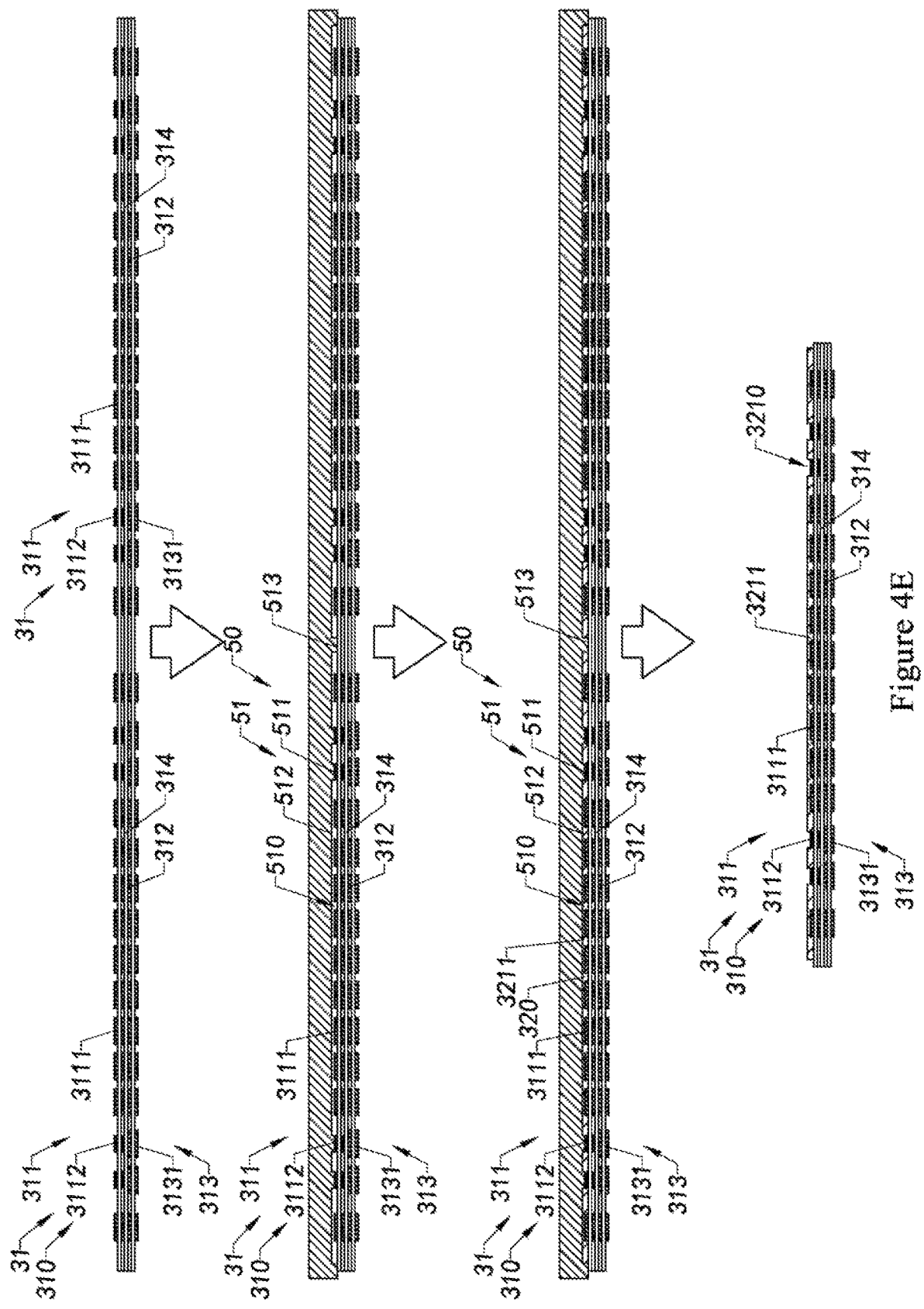
FIG. 4E shows a fifth modified implementation of the molded circuit board according to the above-mentioned first example of the present invention.

FIG. 4E shows a fifth modified implementation of the molded circuit board 30 of the camera module 1 according to the above-mentioned example of the present invention. Compared with the above-mentioned example according to the present invention, the molded circuit board 30 according to the fifth modified implementation of the present invention is different in that: by adopting a splicing process, a plurality of the circuit board main bodies 31 are simultaneously put into a molding die to mold the plurality of circuit board main bodies 31, thereby forming a plurality of the molded structures 32 at a time. It is worth noting that since a plurality of the circuit board main bodies 31 are simultaneously molded to form corresponding molded structures 32 on the plurality of circuit board main bodies 31, therefore, while the manufacturing efficiency of the molded circuit board 30 is improved, it also helps to ensure that the molded circuit board 30 can provide a flat chip mounting surface.

Exemplarily, as shown in FIG. 4E, after placing the two combined circuit board main bodies 31 on the corresponding upper die 51, the upper die 51 is operated for clamping, so that the pressing surface 511 of the upper die 51 is pressed against the surface of the pad 3112, and an indenter 513 of the upper die 51 is pressed against a joint positon of the circuit board main body 31, wherein a front molding space 510 is formed between the upper molded surface 512 of the upper die 51 and the front conductive circuit 3111 of the front circuit layer 311 and the surface of the substrate layer 314 of each circuit board main body 31; next, the insulating molding material 320 is injected into each of the front molding spaces 510 to form, after curing, the front molded layer 3211 that simultaneously covers the front conductive circuit 3111 and the substrate layer 314, thereby making a semi-finished molded circuit board; finally, after the upper die 51 is operated for drafting to take out the semi-finished molded circuit board, the semi-finished molded circuit board is then cut along the junction positon of the two circuit board main bodies 31 to obtain two of the molded circuit boards 30. It can be understood that, in this example of the present invention, since the indenter 513 of the upper die 51 is directly pressed against the circuit board main body 31, at least a part of the circuit board main body 31 of the molded circuit board 30 (such as at least one side of the circuit board main body 31) is exposed to the outside because it is not covered by the front molded layer 3211, that is, there is at least one exposed part on the circuit board main body 31 of the molded circuit board 30. Of course, in other examples of the present invention, the exposed part of the circuit board main body 31 of the molded circuit board 30 may be subsequently covered with other insulating materials, or the exposed part of the circuit board main body 31 of the molded circuit board 30 can also be cut off directly.

Figure 3B:
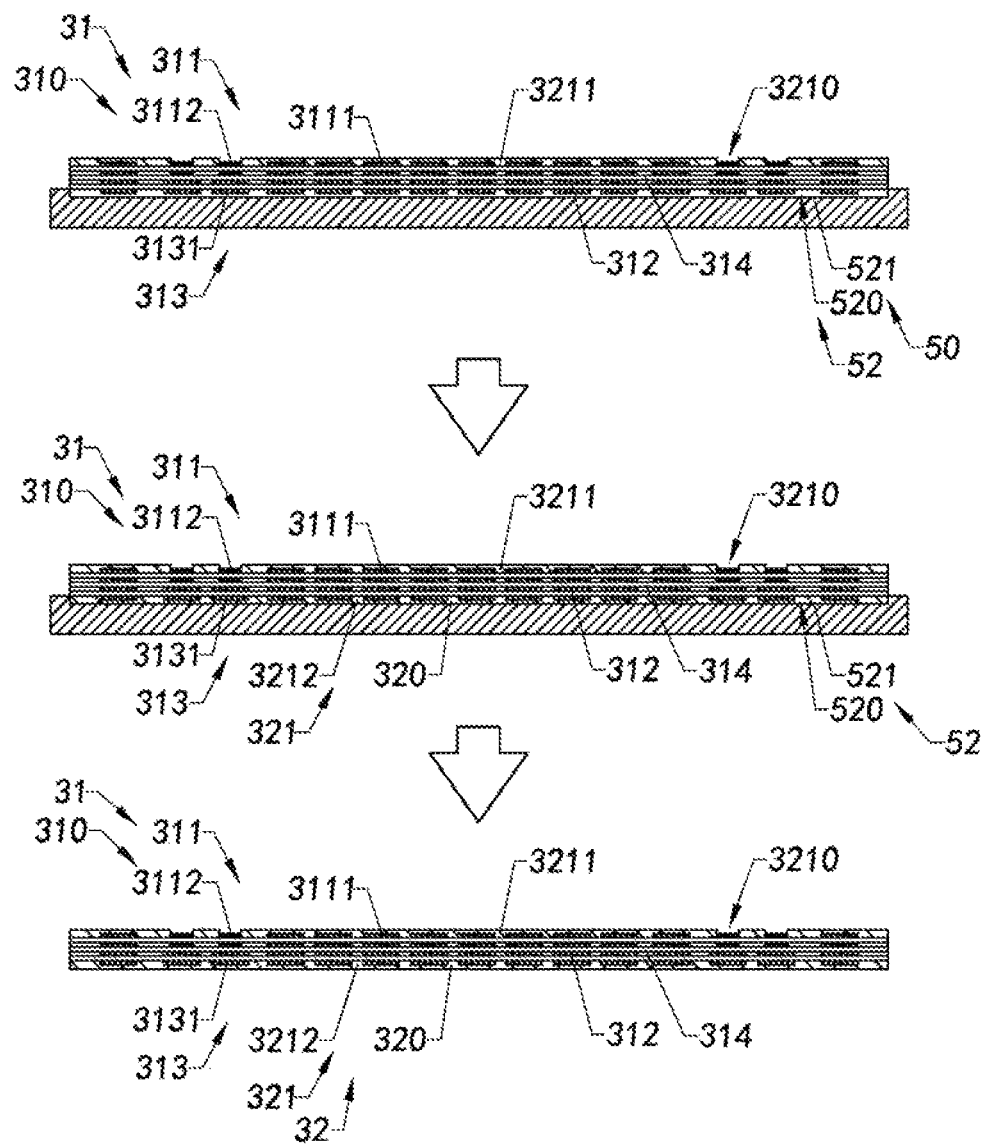
FIG. 3B shows a schematic diagram of the other manufacturing process of the molded circuit board according to the above-mentioned first example of the present invention.

It is worth mentioning that, in the above-mentioned example of the present invention, as shown in FIGS. 2 and 3B, the molded layer 321 of the molded structure 32 of the molded circuit board 30 may further include the back molded layer 3212 formed by curing the insulating molding material 320 on the back surface of the circuit board main body 31 by the molding process, wherein the back molded layer 3212 covers the surface of the back conductive circuit 3131 of the back circuit layer 313 and the surface of the substrate layer 314 located on the back surface of the circuit board main body 31 to protect the back conductive circuit 3131. It is understandable that, in this example of the present invention, since the back circuit layer 313 of the circuit board main body 31 only includes the back conductive circuit 3131, and does not includes the pad, therefore, during the molding process of molding the back molded layer 3212, it is not necessary to consider whether the pads are exposed or not, and the molding is directly performed by the molding die 50. Of course, in other examples of the present invention, the molded structure 32 of the molded circuit board 30 may also only includes the back molded layer 3212 or the front molded layer 3211, and the surface of the circuit board main body 31 without providing the molded layer may be provided with the ink layer.

Specifically, as shown in FIG. 3B, the molding die 50 further includes a lower die 52, wherein the lower die 52 can be moved for clamping and drafting, and when the molding die 50 is in a clamping state, a back molding space 520 is formed between the lower die 52 and the back surface of the circuit board main body 31, wherein the back molded layer 3212 of the module structure 32 is formed by adding the insulating molding material to the back molding space 520 and curing.

More specifically, as shown in FIG. 3B, the lower die 52 of the molding die 50 has a flat lower molded surface 521, so that when the circuit board main body 31 is placed on the lower die 52, the back molding space 520 is formed between the lower molded surface 521 of the lower die 52 and the back surface of the circuit board main body 31, so that the insulating molding material 320 is cured in the back molding space 520 to form a molded layer 3212 that simultaneously covers the back conductive circuit 3131 of the back circuit layer 313 and the back molded layer 3212 of the substrate layer 314. Of course, in other examples of the present invention, the back molded layer 3212 may also only cover the substrate layer 314 on the back surface of the circuit board main body 31, and not cover the back conductive circuit 3131 of the back circuit layer 313, that allows the back conductive circuit 3131 to be exposed to the outside.

Exemplarily, as shown in FIG. 3B, after the circuit board main body 31 is placed on the lower die 52, the lower die 52 is operated for clamping, so that the back molding space 520 is formed between the lower molded surface 521 of the lower die 52 and the back surface of the circuit board main body 31; then, the insulating molding material 320 is injected into the back molding space 520 to form, after curing, the back molded layer 3212 that simultaneously covers the back conductive circuit 3131 and the substrate layer 314; finally, after the insulating molding material 320 is cured to form the back molded layer 3212, the lower die 52 is operated for drafting, the molded circuit board 30 is taken out from the molding die 50.

It is worth noting that the back molded layer 3212 and the front molded layer 3211 of the molded layer 321 of the molded structure 32 can be molded together by the molding die 50 through a molding process. Alternatively, the back molded layer 3212 and the front molded layer 3211 of the molded structure 32 can also be separately molded by a molding process. Of course, the back molded layer 3212 may be molded by the lower die 52 of the molding die 50 after the front molded layer 3211 is molded; or it may be molded by the lower die 52 of the molding die 50 before the front molded layer 3211 is molded, which is not further limited in the present invention.

In addition, in order to further enhance the heat dissipation capability of the molded circuit board 30, the circuit board main body 31 of the molded circuit board 30 may further include a copper clad layer (not shown in the figure), wherein the copper clad layer and the back circuit layer 313 are provided on the back surface of the circuit board main body 31 at intervals, so that the copper clad layer does not contact the back conductive circuit 3131 of the back circuit layer 313, which facilitates to enhance the heat dissipation performance of the molded circuit board 30 with the copper clad layer.

Further, the back molded layer 3212 can have a similar molding manner as the front molded layer 3211, so that the back molded layer 3212 only covers the back conductive circuit 3131 of the back circuit layer 313, without covering the copper clad layer, so that the copper clad layer is exposed to the outside, so as to maximize the heat dissipation performance of the molded circuit board 30. In other words, during the process of molding the back molded layer 3212, the copper clad layer can achieve the purpose of being exposed outside the back molded layer 3212 in a same way that the pad 3112 is exposed outside the front molded layer 3211 in the above example, and the present invention will not describe it.

According to the above-mentioned example of the present invention, as shown in FIG. 2, the molded circuit board 30 further includes a set of electronic components 33, and each of the electronic components 33 can be mounted on the pad 3112 of the front circuit layer 311 of the circuit board main body 31 by a process such as SMT (Surface Mount Technology). It is worth mentioning that in this example of the present invention, the photosensitive chip 20 and each of the electronic components 33 can be mounted after the front molded layer 3211 of the molded circuit board 30 is formed, and the photosensitive chip 20 is mounted on the chip mounting surface of the front molded layer 3211 to correspond to the chip mounting area 3101 of the circuit board main body 31, and each of the electronic components 33 are respectively mounted on the pads 3112 to correspond to the edge areas 3102 of the circuit board main body 31. It should be understood that, in the camera module of the present invention, the type of the electronic component 33 may not be limited. For example, the electronic component 33 can be implemented as a resistor, a capacitor, a driving device, and the like.

In addition, after the photosensitive chip 20 is mounted on the front molded layer 3211 of the molded structure 32 of the molded circuit board 30, the photosensitive chip 20 can be electrically connected to the pad 3112 of the front circuit layer 311 by a gold wire process to conduct the photosensitive chip 20 and the molded circuit board 30.

It is worth mentioning that, as shown in FIG. 2, in the above-mentioned first example of the present invention, the camera module 1 further includes a filter assembly 40, wherein the filter assembly 30 is correspondingly provided between the the optical lens 11 of the lens assembly 10 and the photosensitive chip 20, so that the light entering through the optical lens 11 is received by the photosensitive chip 20 after passing through the filter assembly 40, thereby improving the imaging quality of the camera module 1.

Specifically, the filter assembly 40 includes a filter element 41 and a base 42, wherein the filter element 41 is assembled on the base 42, and the base 42 is correspondingly provided on the position of the front molded layer 3211 of the molded structure 32 of the molded circuit board 30 corresponding to the edge area 3102 of the circuit board main body 31, so that while the filter element 41 is located between the photosensitive chip 20 and the optical lens 11, the filter element 41 also corresponds to the photosensitive path of the photosensitive chip 20, wherein the size of the filter element 31 is larger than that of the photosensitive area of the photosensitive chip 20 to ensure that the light entering the interior of the camera module 1 from the optical lens 11 is filtered by the filter element 41 before being received by the photosensitive chip 20 for photoelectric conversion, thereby the imaging quality of the camera module 1 is improved, for example, the filter element 41 can filter the infrared part of the light entering the interior of the camera module 1 from the optical lens 11.

Preferably, the base 42 is implemented as a separately manufactured bracket base 421, wherein the bracket base 421 is bonded to the front molded layer 3211, therefore, while the filter element 41 assembled on the holder base 421 is held in the photosensitive path of the photosensitive chip 20, the bracket base 421 can also serve as a lens holder for mounting the lens assembly 10.

Further, as shown in FIG. 2, the lens assembly 10 of the camera module 1 may further include a driver 12, wherein the optical lens 11 is driveably assembled to the driver 12, and the driver 12 is assembled on the top surface of the bracket base 421 so that the optical lens 11 is held in the photosensitive path of the photosensitive chip 20. In addition, when the camera module 1 is used, the driver 12 can drive the optical lens 11 to move back and forth along the photosensitive path of the photosensitive chip 20 to adjust the focal length of the camera module 1 by adjusting the distance between the optical lens 11 and the photosensitive chip 20, so that the camera module 1 is implemented as a zoom camera module. The type of the driver 12 of the camera module 1 of the present invention is not limited. The driver 2 can be implemented as a voice coil motor, which can be electrically connected to the molded circuit board 30 to be in the working state after receive power and the control signal, the optical lens 11 is driven to move back and forth along the photosensitive path of the photosensitive chip 20. Nevertheless, those skilled in the art can understand that the type of the driver 12 is not limited, as long as it can drive the optical lens 11 to move back and forth along the photosensitive path of the photosensitive chip 20.

Figure 5A:
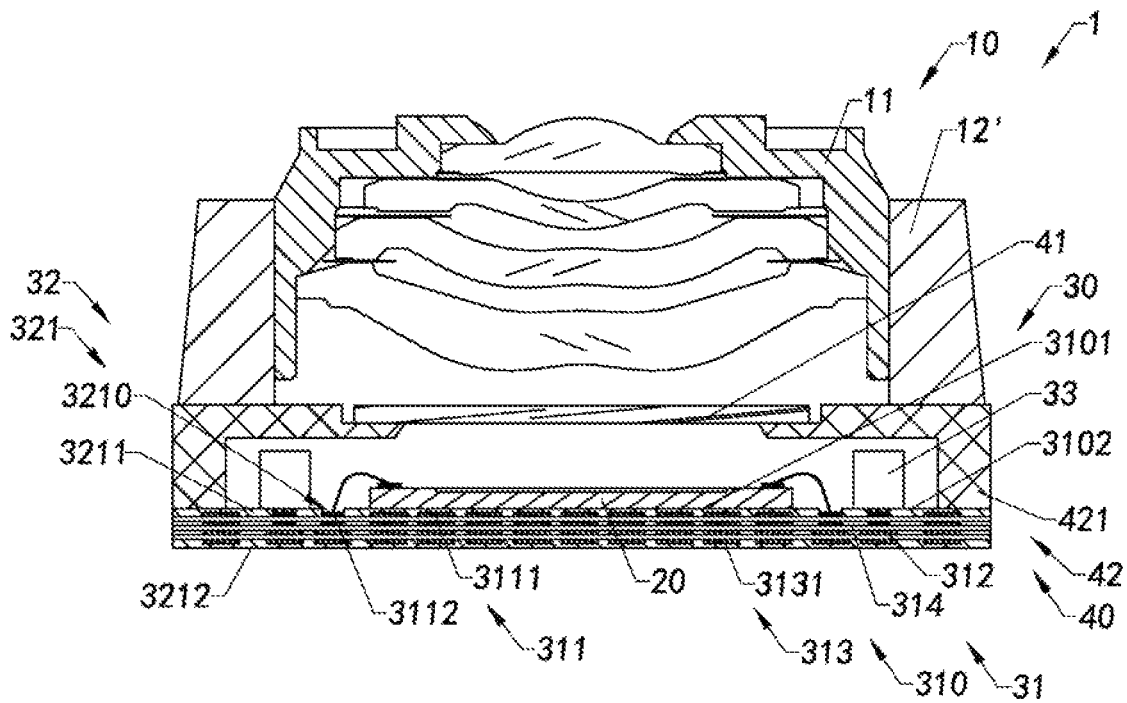
FIG. 5A shows a first modified implementation of the camera module according to the above-mentioned first example of the present invention.

It is worth mentioning that, FIG. 5A shows a first modified implementation of the camera module 1 according to the above-mentioned first example of the present invention. Specifically, compared with the above-mentioned first example according to the present invention, the camera module 1 according to the first modified implementation of the present invention is implemented as a fixed-focus camera module, that is, in this modified implementation of the present invention, the lens assembly 10 of the camera module 1 may not have the driver 12. Specifically, the lens assembly 10 includes a lens barrel 12', wherein the lens barrel 12' is assembled on the top surface of the bracket base 421, and the optical lens 11 is fixedly assembled on the the lens barrel 12', so that the optical lens 11 is held in the photosensitive path of the photosensitive chip 20 by the lens barrel 12'. In addition, in the process of assembling the lens barrel 12' on the top surface of the bracket base 421, the angle at which the lens barrel 12' is assembled on the top surface of the bracket base 421 can be adjusted by a calibration device, so that the optical axis of the optical lens 11 can be perpendicular to the photosensitive surface of the photosensitive chip 20 to ensure the imaging quality of the camera module 1. It can be understood that the lens barrel 12' can be manufactured separately, so that the lens barrel 12' can be provided with thread or not, and the present invention is not limited in this respect.

Figure 5B:
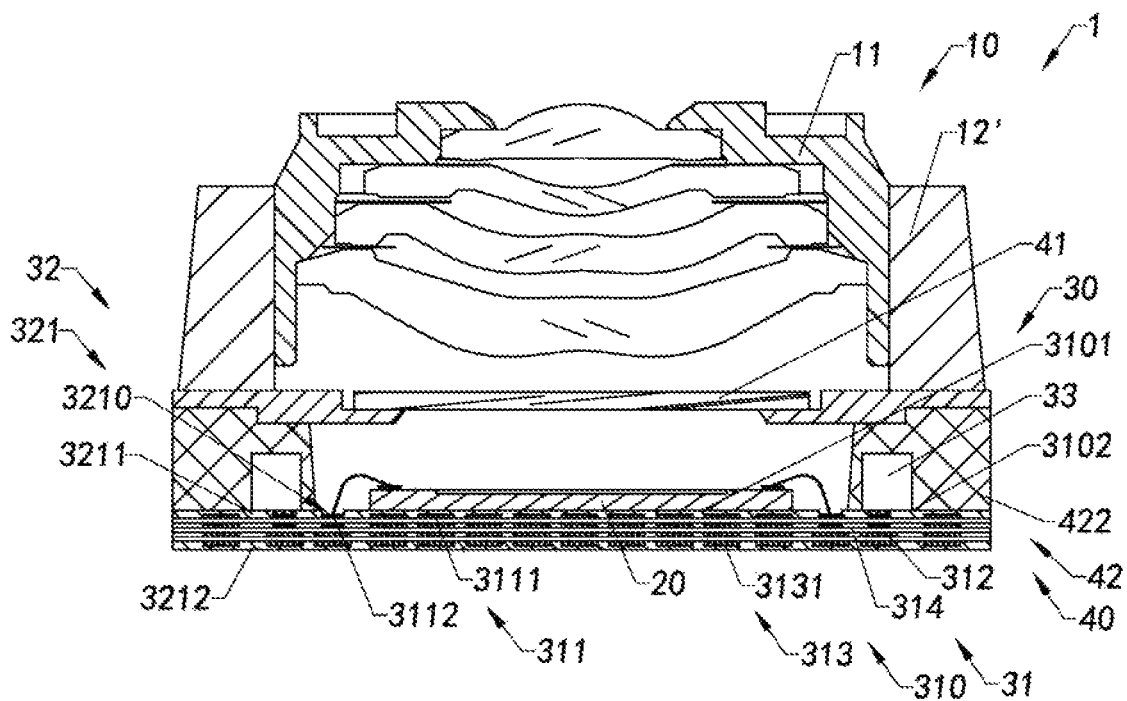
FIG. 5B shows a second modified implementation of the camera module according to the above-mentioned first example of the present invention.

FIG. 5B shows a second modified implementation of the camera module 1 according to the above-mentioned first example of the present invention. Specifically, compared with the first modified implementation according to the present invention, the base 42 of the filter assembly 40 of the camera module 1 according to the second modified implementation of the present invention is implemented as a molded base 422, wherein the molded base 422 is cured at the position on the front molded layer 3211 of the molded circuit board 30 corresponding to the edge area 3102 of the circuit board main body 31 by the molding material through a molding process, wherein the lens barrel 12' is assembled on the top surface of the molded base 422 to hold the optical lens 11 in the photosensitive path of the photosensitive chip 20 by the lens barrel 12'. That is, in this modified implementation of the present invention, the molded base 422 is first manufactured by a molding process, and then the separately manufactured lens barrel 12' is assembled on the top surface of the molded base 422, so that the angle at which the lens barrel 12' is assembled on the top surface of the molded base 422 can be adjusted by a calibration device, so that the optical axis of the optical lens 11 can be perpendicular to the photosensitive surface of the photosensitive chip 20 to ensure the imaging quality of the camera module 1. Of course, in other examples of the present invention, the lens barrel 12' may also extend integrally on the top surface of the molded base 422, that is, the lens barrel 12' and the molded base 422 can be integrally cured by the molding material through a module process, thereby enhancing the stability and reliability of the camera module 1.

Preferably, in this modified implementation of the present invention, as shown in FIG. 5B, the molded base 422 covers the electronic components 33 on the molded circuit board 30 after being molded, and is mounted on the periphery of the photosensitive chip 20 of the molded circuit board 30 to isolate the adjacent electronic components 33 and isolate the electronic components 33 from the photosensitive chip 20 by the molded base 422.

Figure 5C:
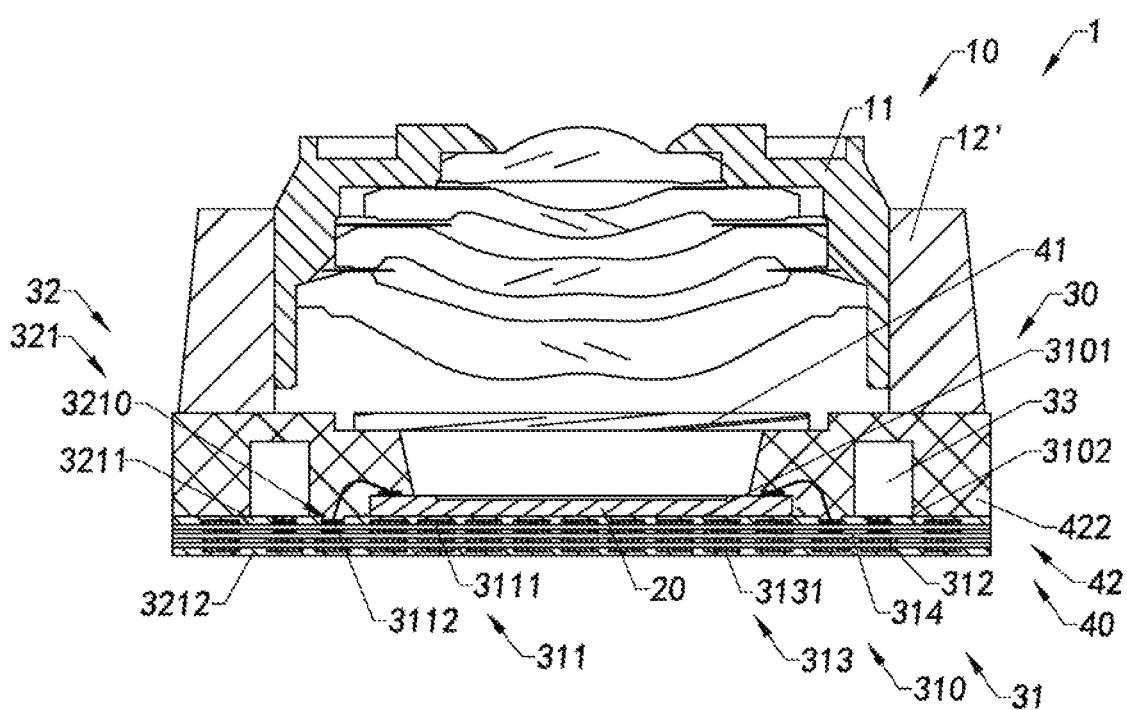
FIG. 5C shows a first modified implementation of the camera module according to the above-mentioned first example of the present invention.

FIG. 5C shows a third modified implementation of the camera module 1 according to the above-mentioned first example of the present invention. Specifically, compared with the above-mentioned second modified implementation according to the present invention, the camera module 1 according to the third modified implementation of the present invention is different in that: the molded base 422 covers the electronic components 33 on the molded circuit board 30 and the non-photosensitive area of the photosensitive chip 20 after being molded to securely mount the photosensitive chip 20 on the molded circuit board 30, thereby realizing a compact structure, and reducing the influence of dirt on the electronic components and the circuit board main body on the photosensitive chip 20.

Preferably, as shown in FIG. 5C, the module base 422 has a stepped structure to provide a lower mounting surface for the filter element 41 and a higher mounting surface for the lens barrel 12', in order to reduce the distance between the filter element 41 and the photosensitive chip 20, which helps to reduce the overall height of the camera module 1. It is understandable that since the molded base 422 is integrally formed on the molded circuit board 30 through a molding die, the molded base 422 can provide a relatively flat mounting surface, so that the filter element 41 can be substantially parallel to the photosensitive chip 20 with a small tilt.

Figure 5D:
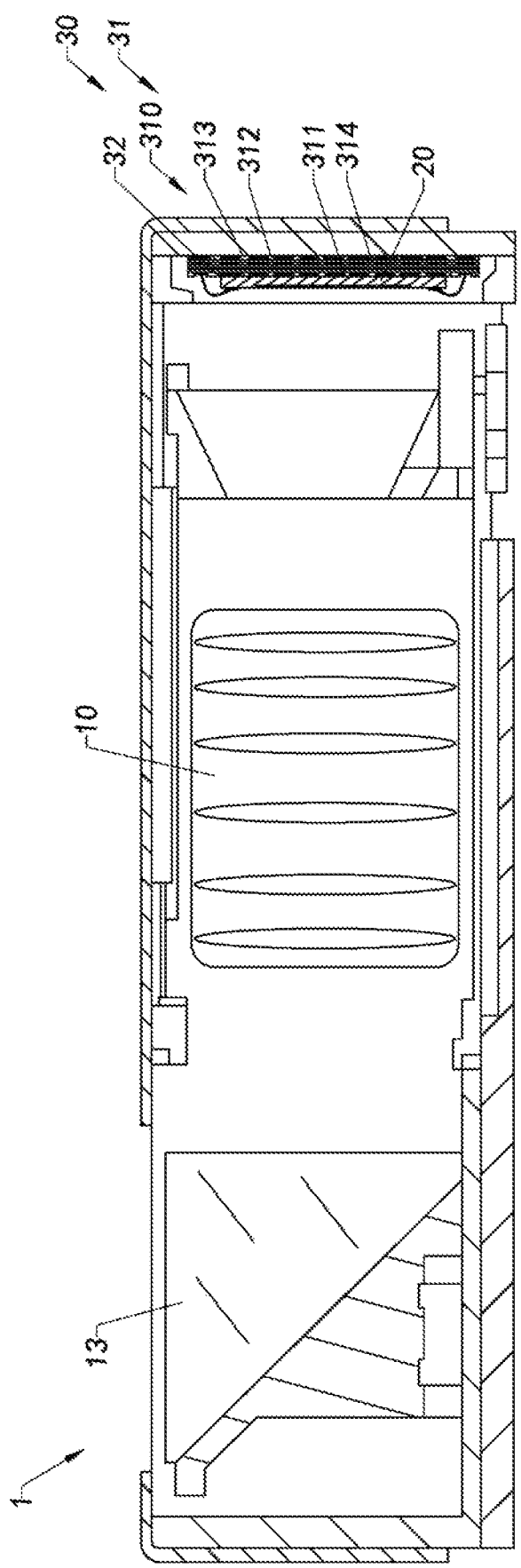
FIG. 5D shows a second modified implementation of the camera module according to the above-mentioned first example of the present invention.

FIG. 5D shows a fourth modified implementation of the camera module 1 according to the above-mentioned first example of the present invention. Specifically, compared with the above-mentioned first example according to the present invention, the camera module 1 according to the fourth modified implementation of the present invention is implemented as a periscope camera module, that is, the camera module 1 further includes a light turning mechanism 13, wherein the light turning mechanism 13 is provided on the photosensitive path of the photosensitive chip 20 for turning the light entering the light turning mechanism 13, so that the light turned by the light turning mechanism 13 is received by the photosensitive chip 20 after passing through the optical lens 11. It is understandable that since the periscope camera module can be mounted to various electronic device main bodies in a "horizontal" installation manner, the height of the periscope array module can be reduced, so that after the periscope camera module is mounted on the electronic device main body, the thickness of the electronic device main body is not increased, thereby conforming to the development trend of thinning and lightening of the electronic device.

Figure 6:
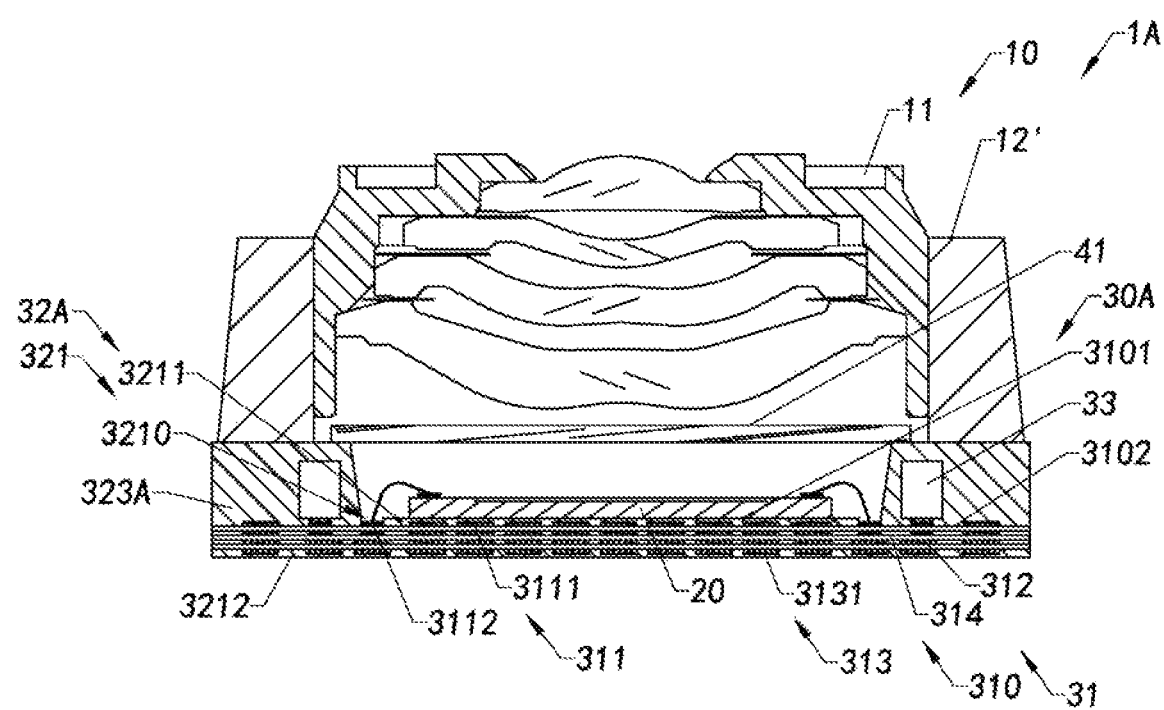
FIG. 6 shows a schematic cross-sectional view of a camera module according to a second example of the present invention.
Figure 7:
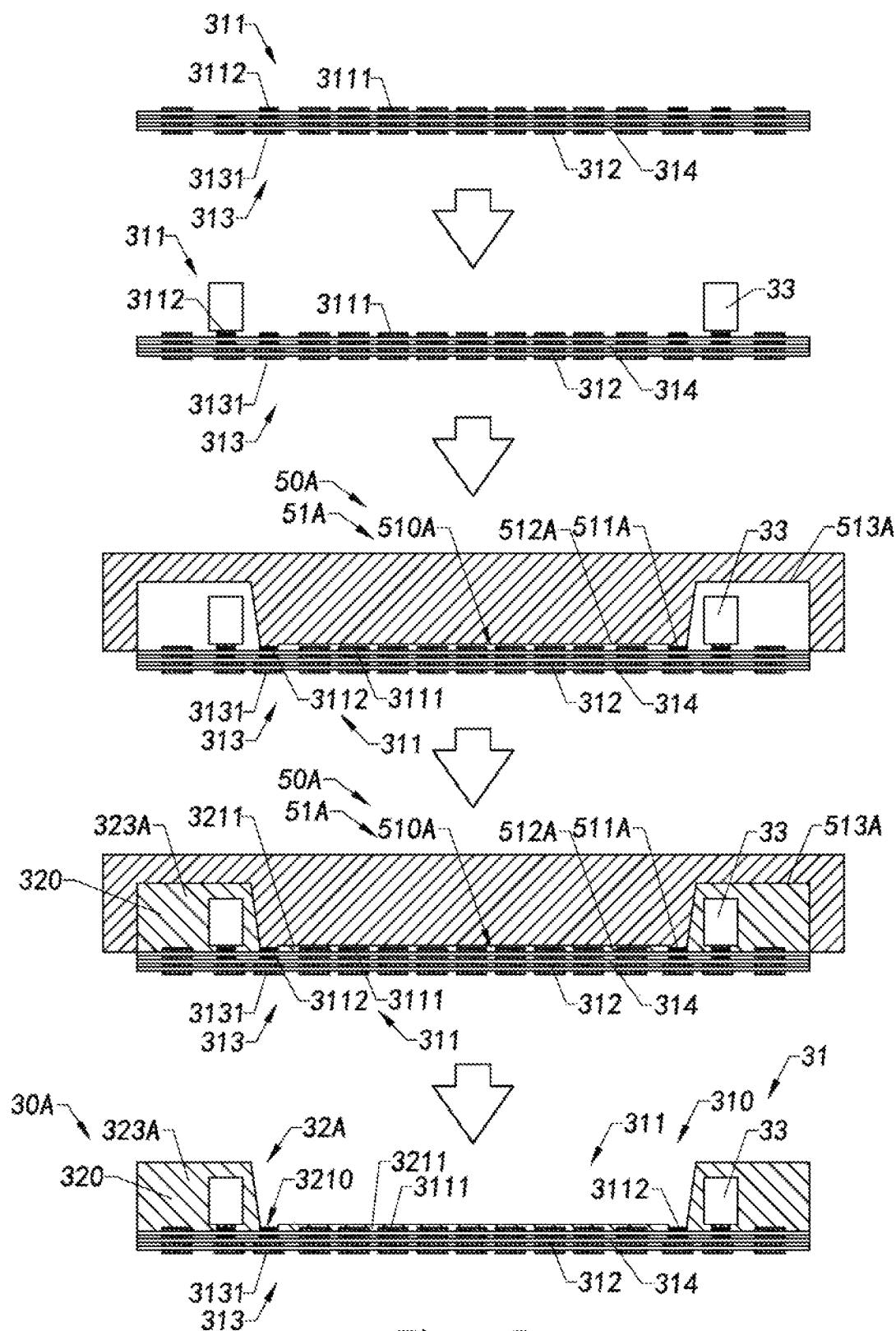
FIG. 7 shows a schematic diagram of the manufacturing process of the molded circuit board of the camera module according to the above-mentioned second example of the present invention.

Referring to FIGS. 6 and 7 of the accompanying drawings of the specification, a camera module 1A according to a second example of the present invention is illustrated. Compared with the first example according to the present invention, the second example according to the present invention is different in that: a molded structure 32A of a molded circuit board 30A of the camera module 1A further includes a molded package body 323A, wherein the molded package body 323A integrally extends from a front molded layer 3211 to replace the base in the filter assembly 40, so that the filter element 41 and the lens assembly 10 can be directly assembled to the molded package body 323A of the molded circuit board 30A, so as to keep the filter element 41 and the optical lens 11 of the lens assembly 10 located in the photosensitive path of the photosensitive chip 20. Preferably, the molded package body 323A covers the electronic components 33 of the molded circuit board 30A, so that the molded package body 323A isolates the adjacent electronic components 33, and isolates the electronic components 33 and the photosensitive chip 20, so as to reduce the contamination of the photosensitive chip 20 caused by the dirt carried on the electronic components 33.

Further, as shown in FIG. 7, the molded package body 323A of the molded structure 32A and the front molded layer 3211 are cured together by the insulating molding material 320 on the front surface of the circuit board main body 31 by the molding process, so as to cover the electronic components 33 of the molded circuit board 30A by the molded package body 323A, and the surface of the front conductive circuit 3111 of the front circuit layer 311 and the surface of the substrate layer 314 on the front surface of the circuit board main body 31 are covered by the front molded layer 3211, so that the surface of the pad 3112 of the front circuit layer 311 is exposed to the outside. In other words, at the time of manufacturing the molded circuit board 30A, the electronic component 33 may be mounted on the pad 3112 of the front circuit layer 311 of the circuit board main body 31 first by soldering through solder; place the circuit board main body 31 into a molding die 50A for a molding process, to form the front molded layer 3211 and the molded package body 323A of the molded structure 32A by curing the insulating molding material 320 on the front surface of the circuit board main body 31, wherein the front molded layer 3211 covers the surface of the front conductive circuit 3111 of the front circuit layer 311 and the substrate layer 314 of the front surface of the circuit board main body 31, and a part of the pad 3112 is exposed to the outside, and is electrically connected to the photosensitive chip 20. It is worth noting that, since the molded package body 323A and the front molded layer 3211 are integrally formed by the molding die 50A, the mounting surface provided by the molded package body 323A can maintain good parallelism with the chip mounting surface provided by the front molded layer 3211, which not only helps to ensure that the photosensitive chip 20 and the filter element 41 are parallel to each other, but also helps to ensure that the optical axis of the optical lens 11 is perpendicular to the photosensitive surface of the photosensitive chip 20.

Specifically, as shown in FIG. 7, the molding die 50A includes an upper die 51A, wherein the upper die 51A can be moved for clamping and drafting operations, and when the molding die 50A is in a clamping state, a front molding space 510A is formed between the upper die 51A and the front surface of the circuit board main body 31, wherein the front molded layer 3211 and the molded package body 323A of the molded structure 32A are formed by adding the insulating molding material 320 to the front molding space 510A and curing.

More specifically, as shown in FIG. 7, the upper die 51A of the molding die 50A has a pressing surface 511A, a first upper molded surface 512A, and a second upper molded surface 513A, wherein the pressing surface 511A of the upper die 51A corresponds to the pad 3112 of the front circuit layer 311 of the circuit board main body 31, and the second upper molded surface 513A of the upper die 51A is located around the first upper molded surface 512A of the upper die 51A, and the second upper molded surface 513A of the upper die 51A corresponds to the electronic component 33. The pressing surface 511A of the upper die 51A is lower than the first upper molded surface 512A of the upper die MA, and the first upper molded surface 512A of the upper die MA is lower than the second upper molded surface 513A of the upper die MA (that is, the upper die MA has a stepped inner surface), when the pressing surface 511A of the upper die 51A is pressed against the corresponding pad 3112, there is still a gap between the first upper molded surface 512A of the upper die 51A and the front conductive circuit 3111, there is a gap between the second upper molded surface 513A of the upper die 51A and the top surface of the electronic component 33 to ensure that the insulating molding material 320 can enter the gap between the first upper molded surface 512A and the front conductive circuit 3111 and the gap between the second upper molded surface 513A and the electronic component 33, which enables the cured front molded layer 3211 to cover the front conductive circuit 3111, and the cured molded package body 323A can cover the electronic component 33 to protect the front conductive circuit 3111 and the electronic component 33.

Exemplarily, as shown in FIG. 7, the electronic component 33 is first mounted on the part of the pad 3112 on the front circuit layer 311 of the circuit board main body 31; and after placing the circuit board main body 31 on the upper die 51A, the upper die 51A is operated for clamping, so that the pressing surface 511A of the upper die 51A is pressed against the surface of the remaining pads 3112 on the front circuit layer 311, and the front molding space 510A is formed between the first and second upper molded surfaces 512A, 513A of the upper die 51A and the front conductive circuit 3111 of the front circuit layer 311, the substrate layer 314, and the surfaces of the electronic components 33; then, the insulating molding material 320 is injected into the front molding space 510A to form, after curing, the front molded layer 3211 that simultaneously covers the front conductive line 3111A and the substrate layer 314A, and to form the molded package body 323A covering the electronic component 33 to manufacture the molded circuit board 30A; finally, after the insulating molding material 320 is cured to form the front molded layer 3211 and the molded package body 323A, the upper die 51A is operated for drafting, and the molded circuit board 30A is taken out from the molding die 50A. Of course, in this example of the present invention, after the back molded layer 3212 is molded on the back surface of the circuit board main body 31, the photosensitive chip 20, the filter element 41, and the lens assembly 10 can be mounted on the molded circuit board 30A in sequence, the lens assembly 10 can be assembled into the camera module 1A.

It is worth noting that, in the above-mentioned example of the present invention, the front molded layer 3211 of the molded structure 32A covers the chip mounting area 3101 and the edge area 3102 of the circuit board main body 31, so that the photosensitive chip 20 is mounted on the front molded layer 3211 of the molded structure 32A of the molded circuit board 30A, in order to reduce the adverse effect of the circuit board main body 31 on the mounting accuracy of the photosensitive chip 20 through the front molded layer 3211. Of course, in other examples of the present invention, the photosensitive chip 20 may also be directly mounted on the chip mounting area 3101 of the circuit board main body 31 through an adhesive.

Figure 8A:
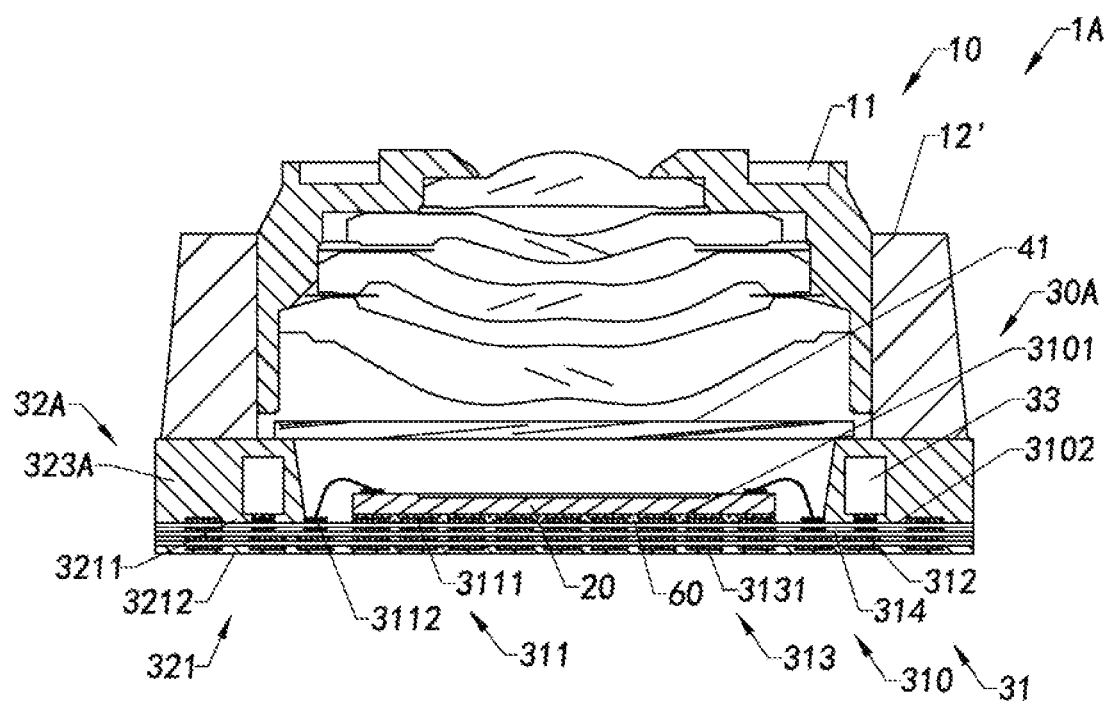
FIG. 8A shows a first modified implementation of the camera module according to the above-mentioned second example of the present invention.

Illustratively, FIG. 8A shows a first modified implementation of the camera module 1A according to the above-mentioned second example of the present invention. Specifically, compared to the above-mentioned second example of the present invention, the camera module 1A according to the first modified implementation of the present invention is different in that: the photosensitive chip 20 is directly mounted on the chip mounting area 3101 of the circuit board main body 31 of the molded circuit board 30A through an adhesive 60; the front molded layer 3211A of the molded layer 321A of the molded structure 32A only covers the front conductive circuit 3111 of the front circuit layer 311 and the substrate layer 314 located at the edge area 3102 of the circuit board main body 31, so that the front conductive circuit 3111 of the front circuit layer 311 located at the chip mounting area 3101 of the circuit board main body 31 is exposed to the outside because it is not covered. In this way, when the photosensitive chip 20 is mounted through the adhesive 60, the adhesive 60 can enter into the gap of the front circuit layer 311, which helps to increase the contact area between the adhesive 60 and the molded circuit boards 30A, which further enhances the mounting strength of the photosensitive chip 20. In addition, in this modified implementation of the present invention, the molded package body 323A of the molded structure 32A only covers the electronic component 33 to prevent the adjacent electronic components 33 from interacting with each other.

It is worth noting that, as shown in FIG. 8A, since the photosensitive chip 20 is directly mounted on the chip mounting area 3101 of the circuit board main body 31, the front molded layer 3211A of the molded structure 32A only covers the edge area 3102 of the circuit board main body 31. Therefore, in the present invention, the molded structure 32A can be molded on the circuit board main body 31 through a molding process, and then the photosensitive chip 20 is mounted on the chip mounting area 3101 of the circuit board main body 31; or, in the present invention, it can also first mount the photosensitive chip 20 on the chip mounting area 3101 of the circuit board main body 31, then the molded structure 32A is molded on the circuit board main body 31 through a molding process, which is not further limited by the present invention.

Figure 8B:
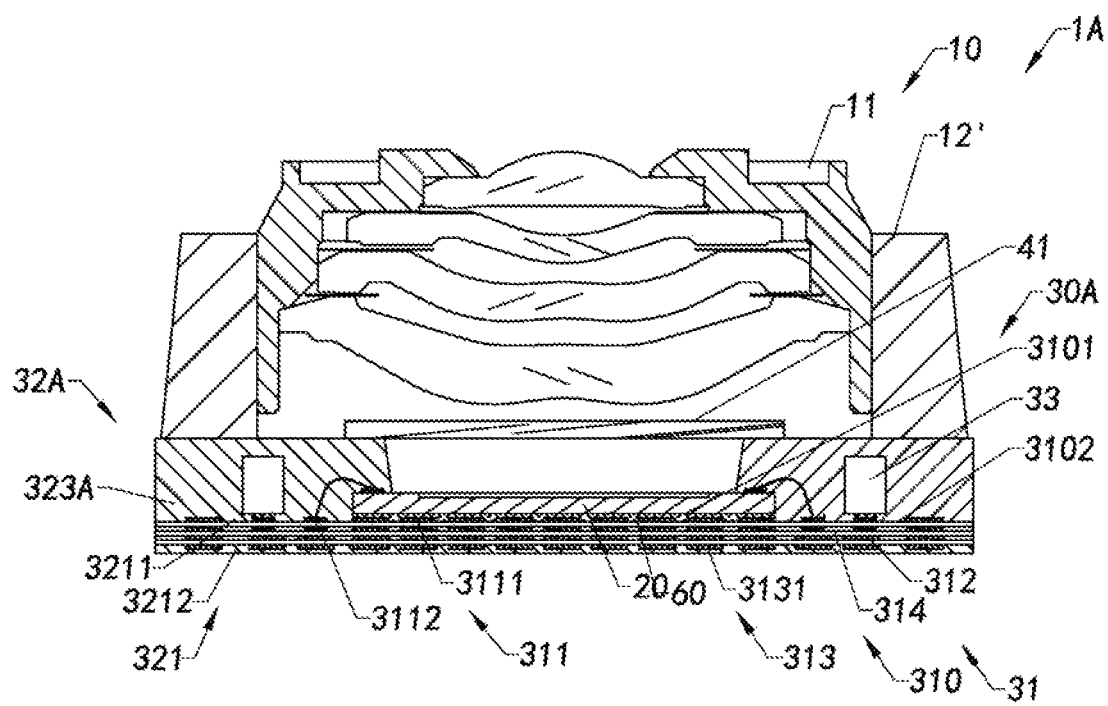
FIG. 8B shows a second modified implementation of the camera module according to the above-mentioned second example of the present invention.

FIG. 8B shows a second modified implementation of the camera module 1A according to the above-mentioned second example of the present invention, specifically, compared with the first modified implementation of the above-mentioned second example of the present invention, the camera module 1A according to the second modified implementation of the present invention is different in that: the molded package body 323A of the molded structure 32A simultaneously covers the electronic component 33 and the non-photosensitive area of the photosensitive chip 20 to further strengthen the bonding strength between the photosensitive chip 20 and the molded circuit board 32A, and also helps to avoid contamination of the photosensitive chip 20 caused by dirt on the circuit board main body 31. It is worth noting that, since the molded package body 323A of the molded structure 32A covers the non-photosensitive area of the photosensitive chip 20, before the molded structure 32A is molded on the circuit board main body 31 through a molding process, the photosensitive chip 20 needs to be attached to the chip mounting area 3101 of the circuit board main body 31 through the adhesive 60, and the photosensitive chip 20 is electrically connected to the circuit board main body 31.

It is worth noting that in the second example of the present invention and its modified implementations, in addition to the above-mentioned structure, other structures of the camera module 1A is the same as the structures of the camera module 1 according to the first example of the present invention, and the camera module 1A also has modified implementations similar to or the same as the various modified implementations of the camera module 1 of the first example, which will not be repeated here.

According to another aspect of the present invention, an example of the present invention further provides a method for manufacturing a camera module. Specifically, referring to FIG. 9, the method for manufacturing the camera module comprises the steps of:

S100: providing a circuit board main body 31 and forming a molded layer 321(321A) of a molded structure 32(32A) by curing an insulating molding material 320 on at least one surface of the circuit board main body 31 with a molding die 50(50A); S200: mounting at least one photosensitive chip 20 on the molded circuit board 30 (30A), and conductively connecting each of the photosensitive chips 20 to the molded circuit board 30 (30A);

S300: correspondingly providing a lens assembly 10 on the molded circuit board 30 (30A), so that each optical lens 11 of the lens assembly 10 is located in the corresponding photosensitive path of the photosensitive chip 20.

Figure 9:
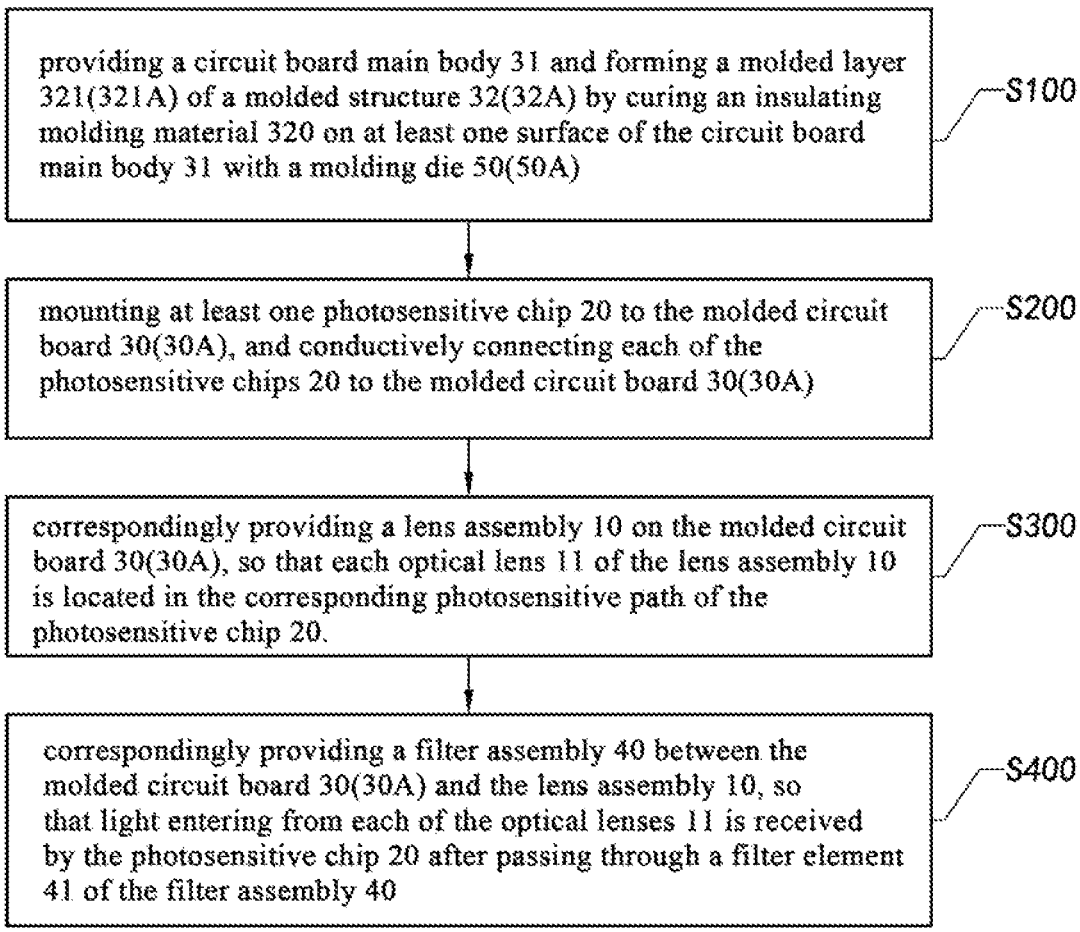
FIG. 9 is a schematic flowchart of a method for manufacturing a camera module according to an example of the present invention.

Further, as shown in FIG. 9, the method for manufacturing the camera module further comprises the steps of:

S400: correspondingly providing a filter assembly 40 between the molded circuit board 30 (30A) and the lens assembly 10, so that the light entering from each of the optical lenses 11 is received by the photosensitive chip 20 after passing through the filter element 41 of the filter assembly 40.

Figure 10A:
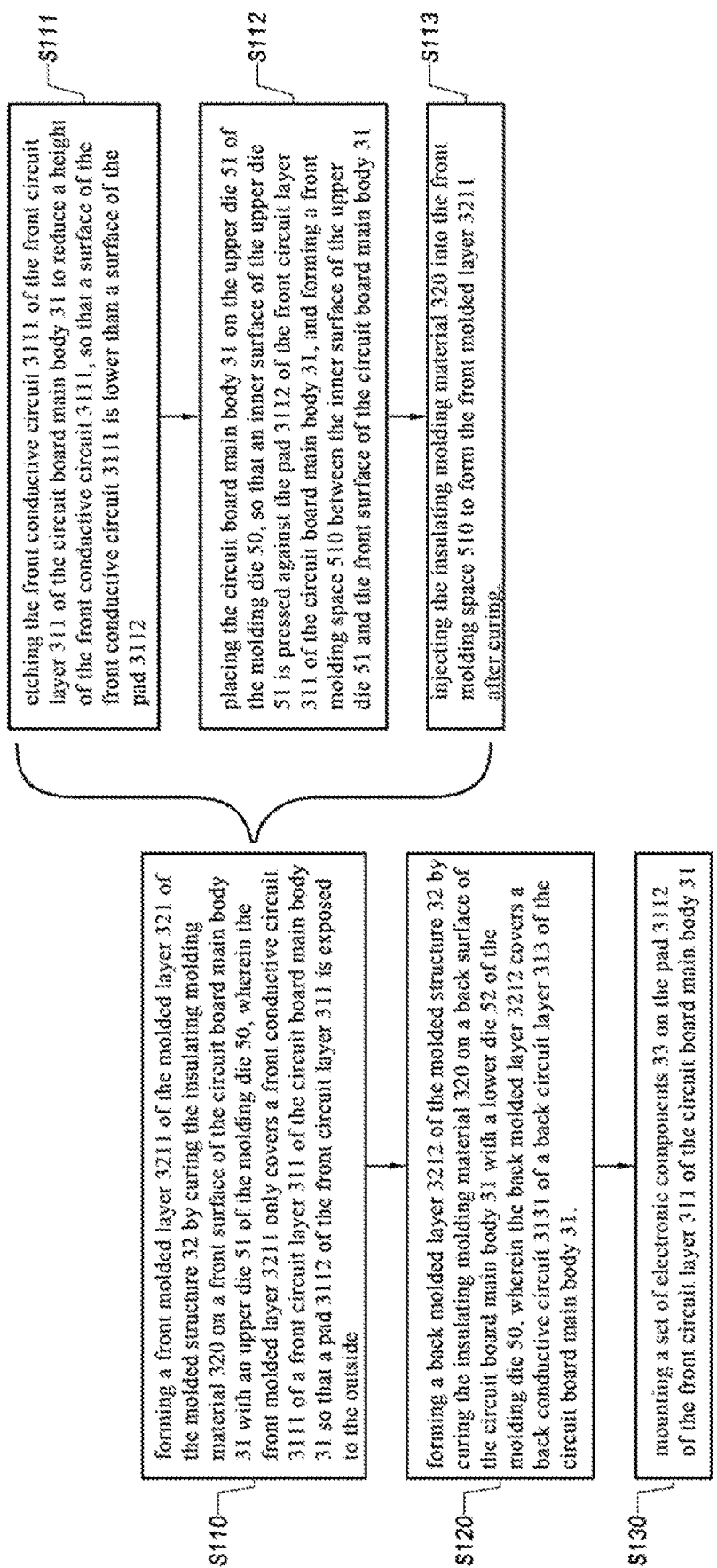
FIG. 10A shows a first implementation of manufacturing a molded circuit board in the method of manufacturing the camera module according to the above-mentioned example of the present invention.

It is worth noting that in the first implementation of the present invention, as shown in FIG. 10A, the step S100 in the method for manufacturing the camera module, that is, the method for manufacturing the molded circuit board 30 (30A), can comprise the steps of:

S110: forming the front molded layer 3211 of the molded layer 321 of the molded structure 32 by curing the insulating molding material 320 on the front surface of the circuit board main body 31 with an upper die 51 of the molding die 50, wherein the front molded layer 3211 only covers the front conductive circuits 3111 of the front circuit layer 311 of the circuit board main body 31, so that the pads 3112 of the front circuit layer 311 are exposed to the outside.

Further, as shown in FIG. 10A, the method for manufacturing the molded circuit board 30 (30A) may comprise the following steps of:

S120: forming the back molded layer 3212 of the molded structure 32 by curing the insulating molding material 320 on the back surface of the circuit board main body 31 with the lower die 52 of the molding die 50, wherein the back molded layer 3212 covers the back conductive circuit 3131 of the back circuit layer 313 of the circuit board main body 31.

Furthermore, as shown in FIG. 10A, the method for manufacturing the molded circuit board 30 (30A) may further comprise the following steps of:

S130: mounting a set of electronic components 33 on the pad 3112 of the front circuit layer 311 of the circuit board main body 31.

It is worth mentioning that, according to the above-mentioned first implementation of the present invention, as shown in FIG. 10A, the step S110 may comprise the steps of:

S112: placing the circuit board main body 31 on the upper die 51 of the molding die 50 so that the inner surface of the upper die 51 is pressed against the pad 3112 of the front circuit layer 311 of the circuit board main body 31, and a front molding space 510 is formed between the inner surface of the upper die 51 and the front surface of the circuit board main body 31; and S113: injecting the insulating molding material 320 into the front molding space 510 to form the front molded layer 3211 after curing.

It is worth noting that the inner surface of the upper die 51 of the molding die 50 can be designed as required to mold the front molded layer 3211 that meets the requirements. For example, the surface of the front conductive circuit 3111 of the front circuit layer 311 is usually flush with the surface of the pad 3112 of the front circuit layer 311. At this time, it can be designed so that the inner surface of the upper die 51 forms a pressing surface 511 and a molded surface 512, wherein the pressing surface 511 is lower than the molded surface 512, so that the upper die 51 has a stepped inner surface. Of course, the upper die 51 may also have a flat inner surface. At this time, the front molded layer 3211 that simultaneously covers the front conductive circuit 3111 and the pad 3112 of the front circuit layer 311 can be molded first, and then grind to expose the pad 3112 to the outside; or the front circuit layer 311 of the circuit board main body 31 can be pre-processed to make the surface of the front conductive circuit 3111 of the front circuit layer 311 to be lower than the surface of the pad 3112.

Exemplarily, as shown in FIG. 10A, in the above-mentioned first implementation of the present invention, before the step S112, the step S110 may further comprises the steps of:

S111: etching the front conductive circuit 3111 of the front circuit layer 311 of the circuit board main body 31 to reduce the height of the front conductive circuit 3111 so that the surface of the front conductive circuit 3111 is lower than the surface of the pad 3112.

Figure 10B:
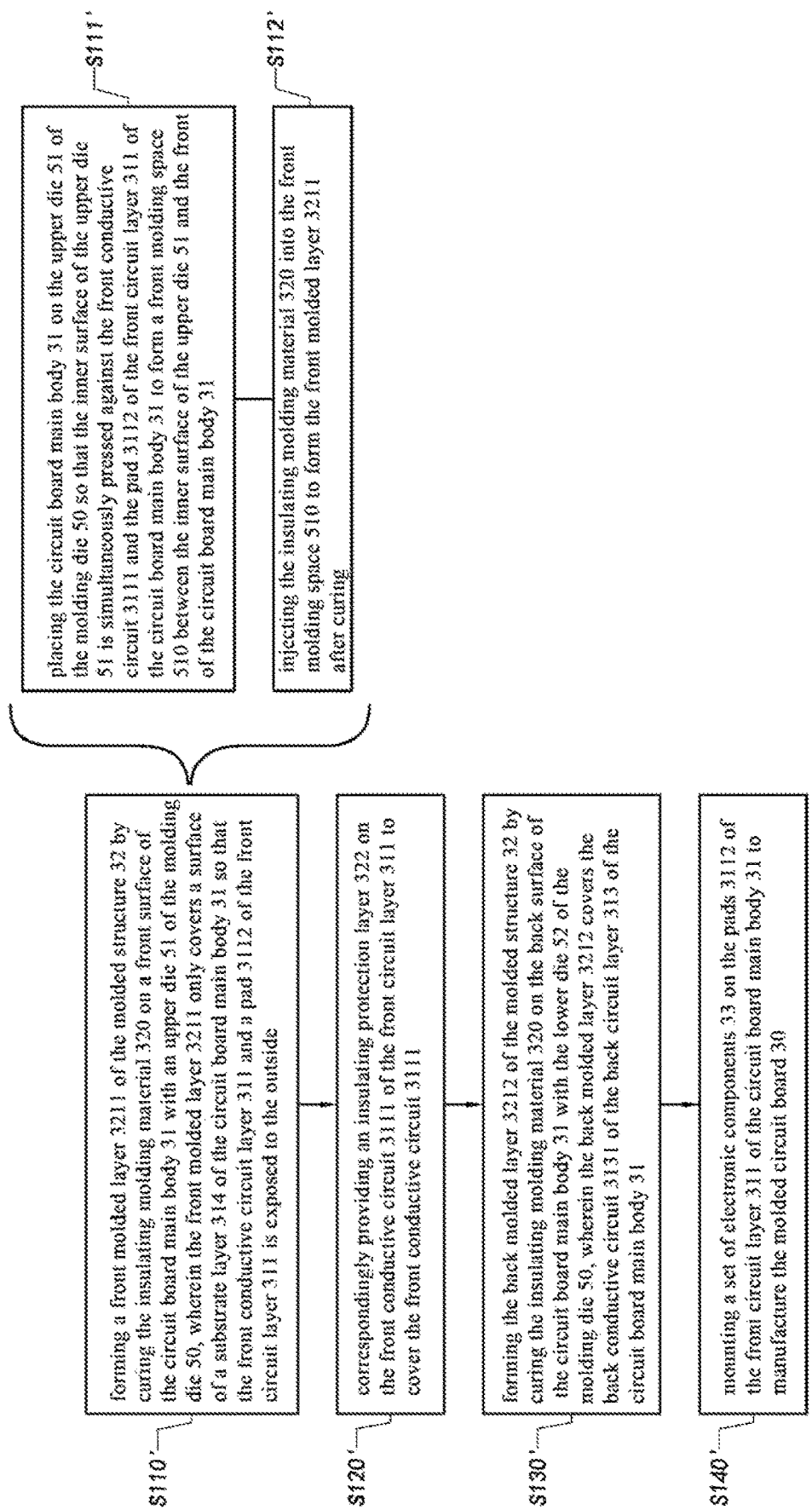
FIG. 10B shows a second implementation of manufacturing a molded circuit board in the method of manufacturing the camera module according to the above-mentioned example of the present invention.

Of course, in other implementations of the present invention, before the step S112, the step S110 may further comprise the step of: depositing metal on the pad 3112 of the front circuit layer 311 of the circuit board main body 31 through a deposition process to increase the height of the pad 3112, so that the surface of the front conductive circuit 3111 is lower than the surface of the pad 3112. In a second implementation of the present invention, as shown in FIG. 10B, the step S100, that is, the method for manufacturing the molded circuit board 30 (30A), may also comprise the steps of:

S110': forming the front molded layer 3211 of the molded structure 32 by curing the insulating molding material 320 with an upper die 51 of the molding die 50, wherein the front molded layer 3211 only covers the surface of the substrate layer 314 of the circuit board main body 31, so that the front conductive circuits 3111 and the pads 3112 of the front circuit layer 311 are exposed to the outside;

S120': correspondingly providing an insulating protection layer 322 on the front conductive circuit 3111 of the front circuit layer 311 to cover the front conductive circuit 3111;

S130': forming the back molded layer 3212 of the molded structure 32 by curing the insulating molding material 320 on the back surface of the circuit board main body 31 with the lower die 52 of the molding die 50, wherein the back molded layer 3212 covers the back conductive circuit 3131 of the back circuit layer 313 of the circuit board main body 31; and S140': mounting a set of electronic components 33 on the pads 3112 of the front circuit layer 311 of the circuit board main body 31 to manufacture the molded circuit board 30.

It is worth noting that, in this second implementation of the present invention, the insulating protection layer 322 may be provided by means such as molding, adhesion, etc., to cover the front conduction circuit 3111 of the front circuit layer 311.

According to the above-mentioned second implementation of the present invention, as shown in FIG. 10B, the step S110' further comprises the steps of:

S111': placing the circuit board main body 31 on the upper die 51 of the molding die 50 so that the inner surface of the upper die 51 is simultaneously pressed against the front conductive circuit 3111 and the pad 3112 of the front circuit layer 311 of the circuit board main body 31 to form a front molding space 510 between the inner surface of the upper die 51 and the front surface of the circuit board main body 31; and S112': injecting the insulating molding material 320 into the front molding space 510 to form the front molded layer 3211 after curing.

Figure 10C:
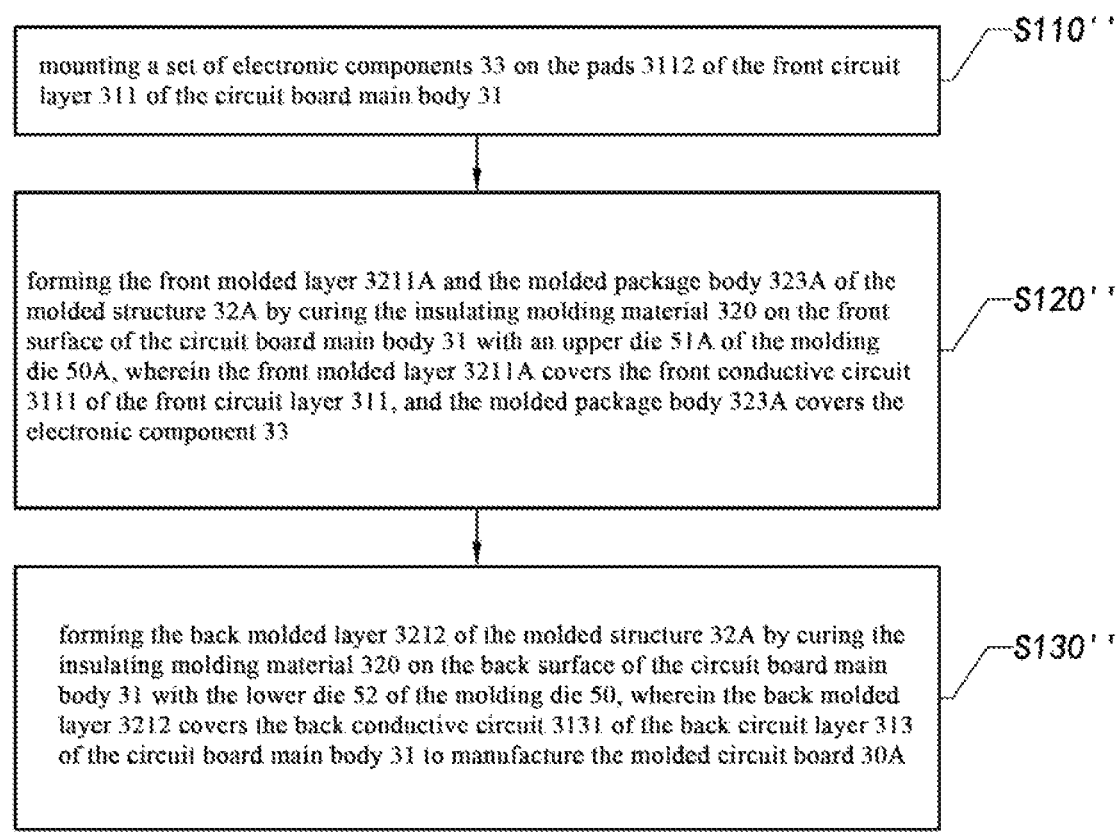
FIG. 10C shows a third implementation of manufacturing a molded circuit board in the method of manufacturing the camera module according to the above-mentioned example of the present invention.

In a third implementation of the present invention, as shown in FIG. 10C, the step S100, that is, the method for manufacturing the molded circuit board 30 (30A), may comprise the steps of:

S110": mounting a set of electronic components 33 on the pads 3112 of the front circuit layer 311 of the circuit board main body 31;

S120": forming the front molded layer 3211A and the molded package body 323A of the molded structure 32A by curing the insulating molding material 320 on the front surface of the circuit board main body 31 with an upper die 51A of the molding die 50A, wherein the front molded layer 3211A covers the front conductive circuit 3111 of the front circuit layer 311, and the molded package body 323A covers the electronic component 33; and S130": forming the back molded layer 3212 of the molded structure 32A by curing the insulating molding material 320 on the back surface of the circuit board main body 31 with the lower die 52 of the molding die 50, wherein the back molded layer 3212 covers the back conductive circuit 3131 of the back circuit layer 313 of the circuit board main body 31 to manufacture the molded circuit board 30A.

It is worth noting that, in some examples of the present invention, the front molded layer 3211A only covers the front conductive circuits 3111 of the front circuit layer 311 located at the edge area 3101 of the circuit board main body 31.

It is worth mentioning that the present invention further provides a modified implementation of the method for manufacturing the camera module according to the above-mentioned example of the present invention. The step S100 may further comprises the steps of: firstly the electronic component 33 and the photosensitive chip 20 are mounted on the front surface of the circuit board main body 31, and the photosensitive chip 20 is electrically connected to the circuit board main body 31; then, the front molded layer 3211A and the molded package body 323A of the molded structure 32A is formed by curing the insulation molding material 320 on the front surface of the circuit board main body 31 with the molding die 50A, wherein the molded package body 323A covers the electronic component 33 and the non-photosensitive area of the photosensitive chip 20.

Figure 11:
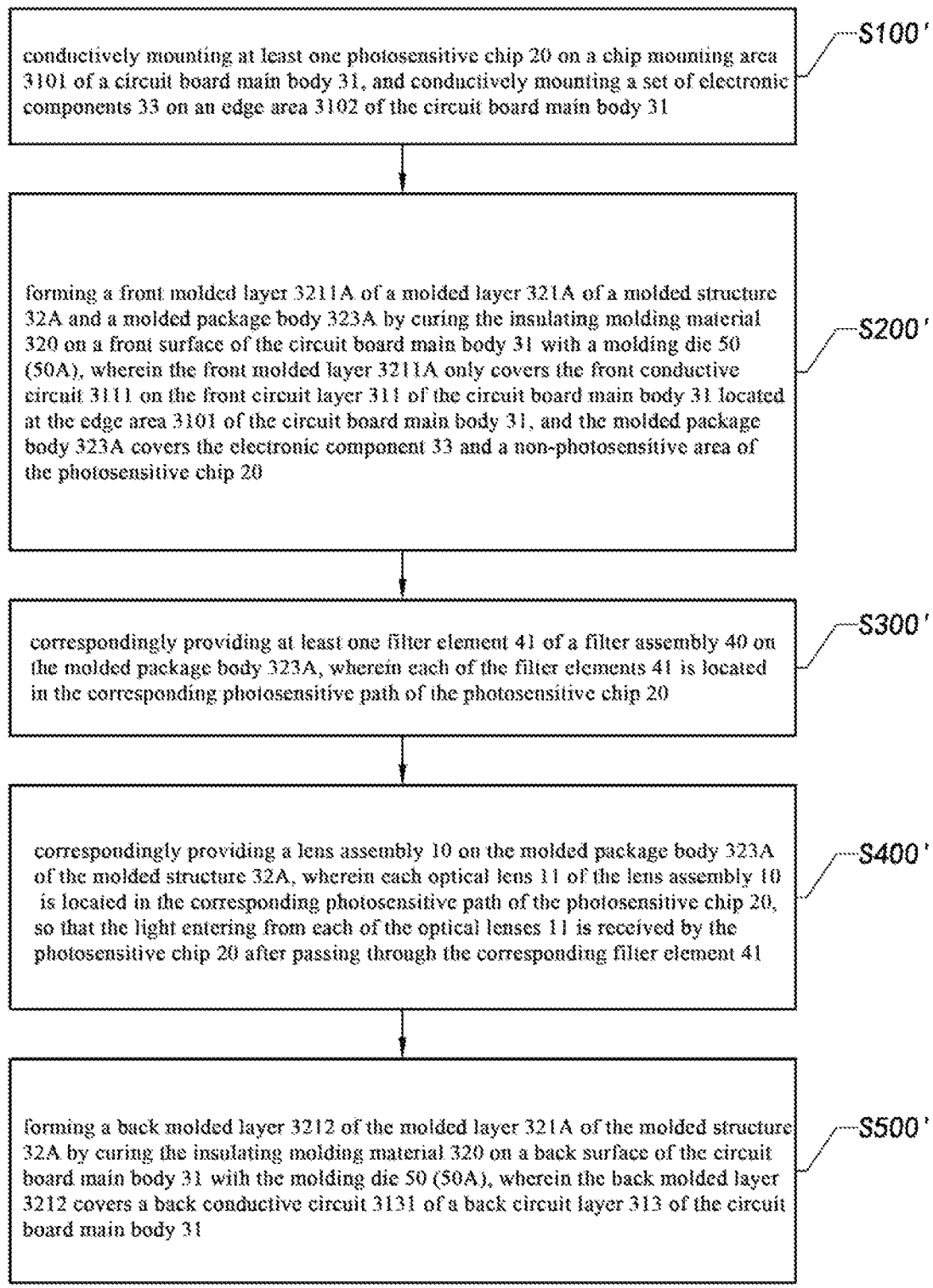
FIG. 11 shows a modified implementation of the manufacturing method of the camera module according to the above-mentioned example of the present invention.

Exemplarily, as shown in FIG. 11, in this modified implementation of the present invention, the method for manufacturing the camera module comprises the steps of:

S100': conductively mounting at least one photosensitive chip 20 on the chip mounting area 3101 of the circuit board main body 31, and conductively mounting a set of electronic components 33 on the edge area 3102 of the circuit board main body 31;

S200': forming the front molded layer 3211A of the molded layer 321A and the molded package body 323A of the molded structure 32A by curing the insulating molding material 320 on the front surface of the circuit board main body 31 with the molding die 50 (50A), wherein the front molded layer 3211A only covers the front conductive circuit 3111 on the front circuit layer 311 of the circuit board main body 31 located at the edge area 3101 of the circuit board main body 31, and the molded package body 323A covers the electronic component 33 and the non-photosensitive area of the photosensitive chip 20;

S300': correspondingly providing at least one filter element 41 of the filter assembly 40 on the molded package body 323A, wherein each of the filter elements 41 is located in the corresponding photosensitive path of the photosensitive chip 20; and S400': correspondingly providing the lens assembly 10 on the molded package body 323A of the molded structure 32A, wherein each optical lens 11 of the lens assembly 10 is located in corresponding the photosensitive path of the photosensitive chip 20, so that the light entering from each of the optical lenses 11 is received by the photosensitive chip 20 after passing through the corresponding filter element 41.

Further, as shown in FIG. 11, the method for manufacturing the camera module further comprises the steps of:

S500': forming the back molded layer 3212 of the molded layer 321A of the molded structure 32A by curing the insulating molding material 320 on the back surface of the circuit board main body 31 with the molding die 50 (50A), wherein the back molded layer 3212 covers the back conductive circuit 3131 of the back circuit layer 313 of the circuit board main body 31.

Figure 12:
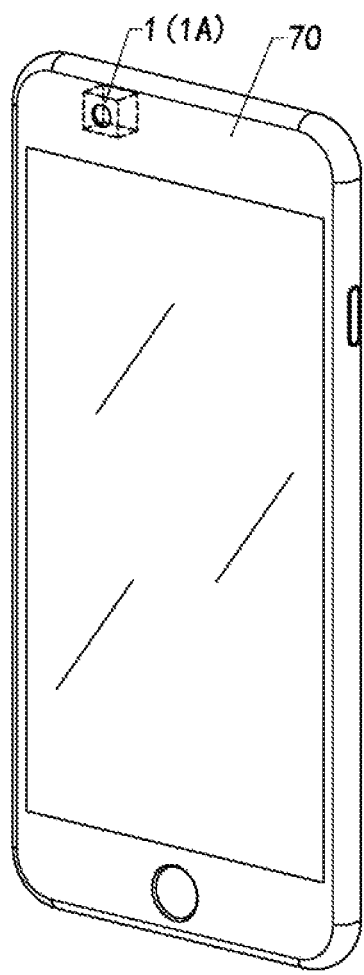
FIG. 12 shows a three-dimensional schematic diagram of an electronic device according to an example of the present invention.

It is worth mentioning that according to another aspect of the present invention, the present invention further provides an electronic device, wherein the electronic device is configured with at least one of the molded circuit boards 30 (30A) for providing mechanical support for fixing and assembling various electronic components such as integrated circuits, etc. For example, in the above-mentioned example of the present invention, the electronic device can be, but is not limited to, implemented as the camera module 1 (1A) configured with the molded circuit board 30 (30A). In other examples of the present invention, the electronic device may also be implemented as various electronic devices such as computers, robots, AR glasses, etc., configured with the molded circuit board 30 (30A). In addition, referring to FIG. 12, according to another aspect of the present invention, the present invention further provides an electronic device, wherein the electronic device includes an electronic device main body 70 and at least one camera module 1 (1A), wherein each of the camera modules 1 (1A) are respectively provided on the electronic device body 70 for capturing images. It is worth mentioning that the type of the electronic device main body 70 is not limited. For example, the electronic device main body 70 can be any electronic device that can be configured with the camera module 1 such as a smart phone, a tablet computer, a notebook computer, an e-book, a personal digital assistant, a camera, etc. Those skilled in the art can understand that, although in FIG. 12, the electronic device main body 70 being implemented as a smart phone is taking as an example, it does not constitute a limitation to the content and scope of the present invention.

It is worth noting that the orientation or positional relationship indicated by "upper", "lower", "inner", "outer" etc. mentioned in the present invention is based on the orientation or positional relationship shown in the drawings, which is only for the convenience of describing the present invention and simplifying the description, rather than indicating or implying that the device or element referred to must have a specific orientation, be configured and operated in a specific orientation.

Those skilled in the art should understand that the above description and the examples of the present invention shown in the accompanying drawings are only examples and do not limit the present invention. The purpose of the present invention has been completely and effectively achieved. The functions and structural principles of the present invention have been shown and explained in the examples. Without departing from the principles, the examples of the present invention may have any deformation or modification.

The invention claimed is:

1. A molded circuit board, characterized in that it comprises:
    a circuit board main body, wherein the circuit board main body includes at least one circuit layer and at least one substrate layer, wherein the circuit layer and the substrate layer are stacked at intervals, and adjacent circuit layers or adjacent substrate layers are not in contact with each other; and
    a molded structure, wherein the molded structure includes a molded layer, wherein the molded layer is stacked on at least one surface of the circuit board main body to cover at least a part of the substrate layer of the circuit board main body, and a material of the molded layer is different from that of the substrate layer:
    wherein a front molded layer of the molded structure is provided with a groove corresponding to a set of pads of a front circuit layer of the circuit board main body to ensure the pads of the front circuit layer expose to the outside.

2. The molded circuit board of claim 1, wherein the front molded layer is stacked on a front surface of the circuit board main body to cover the substrate layer located on the front surface of the circuit board main body.

3. The molded circuit board of claim 2, wherein the front circuit layer is stacked on a front surface of the substrate layer, and the front circuit layer includes a front conductor circuit and the pads conductively connected to the front conductive circuit, and the front molded layer further covers the front conductive circuit of the front circuit layer.

4. The molded circuit board of claim 3, wherein the molded layer covers the front conductive circuit of the front circuit layer of the circuit board main body.

5. The molded circuit board of claim 2, wherein the front circuit layer is stacked on a front surface of the substrate layer, and the front circuit layer includes a front conductive circuit and the pads conductively connected to the front conductive circuit, and the molded structure further includes an insulating protective layer, and the insulating protective layer is stacked on the front molded layer, and corresponds to the front conductive circuit of the front circuit layer of the circuit board main body to cover the front conductive circuit.

6. The molded circuit board of claim 5, wherein a surface of the front conductive circuit of the front circuit layer of the circuit board main body is flush with or lower than a surface of the pad of the front circuit layer.

* * * * *